(12) United States Patent
Hamatani et al.

(10) Patent No.: US 7,777,304 B2
(45) Date of Patent: Aug. 17, 2010

(54) SEMICONDUCTOR DEVICE

(75) Inventors: Tsuyoshi Hamatani, Shiga (JP); Yukitoshi Ota, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/498,188

(22) Filed: Aug. 3, 2006

(65) Prior Publication Data
US 2007/0029641 A1 Feb. 8, 2007

(30) Foreign Application Priority Data
Aug. 3, 2005 (JP) ............................ 2005-224782
Jun. 9, 2006 (JP) ............................ 2006-160369

(51) Int. Cl.
*H01L 23/544* (2006.01)
(52) U.S. Cl. .................. 257/620; 257/E21.596; 257/E21.599; 438/113; 438/458; 438/462
(58) Field of Classification Search .............. 438/113, 438/458, 462; 257/620, E21.596, E21.599
See application file for complete search history.

(56) References Cited

U.S. PATENT DOCUMENTS

| 5,834,829 | A | * | 11/1998 | Dinkel et al. | ................. | 257/620 |
| 6,022,791 | A | * | 2/2000 | Cook et al. | ................. | 438/458 |
| 6,365,958 | B1 | * | 4/2002 | Ibnabdeljalil et al. | ....... | 257/620 |
| 6,876,064 | B2 | * | 4/2005 | Matumoto et al. | .......... | 257/632 |
| 6,943,063 | B2 | * | 9/2005 | Tsai et al. | ................... | 438/118 |
| 7,235,864 | B2 | * | 6/2007 | Lee | ............................ | 257/620 |
| 2004/0084777 | A1 | * | 5/2004 | Yamanoue et al. | .......... | 257/758 |
| 2004/0212047 | A1 | * | 10/2004 | Joshi et al. | .................. | 257/620 |
| 2005/0098893 | A1 | | 5/2005 | Tsutsue et al. | .............. | 257/758 |

FOREIGN PATENT DOCUMENTS

JP    2001-23937    1/2001

* cited by examiner

*Primary Examiner*—Eugene Lee
*Assistant Examiner*—Peniel M Gumedzoe
(74) *Attorney, Agent, or Firm*—Steptoe & Johnson LLP

(57) ABSTRACT

A seal ring is continuously formed along a boundary between a semiconductor element region and a scribe grid region, auxiliary parts are intermittently arranged along the seal ring, and the seal ring is constituted by a metal layer.

19 Claims, 27 Drawing Sheets 7  9  8     5     8  9  7

7 9 8     5     8 9 7

SEMICONDUCTOR DEVICE

BACKGROUND OF THE INVENTION

1. Field of the Invention

The present invention relates to a semiconductor device. In particular, the present invention relates to a technique for preventing a protection film, a wiring layer and an interlayer insulating film in a scribe grid region serving as a boundary region between semiconductor element regions, from occurrence of internal separation, chipping or damage due to an impact caused by dicing in a semiconductor device assembling process.

2. Description of the Related Art

In manufacturing of a semiconductor device, conventionally, after completion of a diffusing step of forming a circuit of a semiconductor element, an assembling step of packaging the semiconductor element is performed. The assembling step includes a dicing step.

As a semiconductor wafer dicing method, commonly, blade dicing is adopted. In the blade dicing, an annular dicing saw, to which particles made of diamond or CNB (Cubic Boron Nitride) are stuck by a bond, is allowed to rotate at a high speed to thereby rupture a semiconductor wafer along a dicing lane serving as a region required for dicing (an actual dicing width of the dicing saw).

A conventional semiconductor wafer has a simple structure that a rigid interlayer insulating film is formed between wiring layers, and wiring layers and interlayer insulating films are small in number. Therefore, chipping or internal separation is hardly occurred in a dicing step of dicing a semiconductor wafer. If such a disadvantage is occurred, an extent of thereof is small. Hence, chipping or internal separation hardly causes reduction in yield of a semiconductor chip obtained by dicing and deterioration in reliability of the semiconductor ship.

In recent years, however, there arise some problems in a dicing step due to the following reasons.

As a technique for finely defining a process rule in a diffusion process is advanced, a boundary region (hereinafter, referred to as a "scribe grid region") between semiconductor element regions on a semiconductor wafer is reduced in area. As a result, the scribe grid region has a little margin for dicing.

A PCM (Process Control Modulation) region becomes complicated and is increased in area. In order to effectively use a scribe grid region, the PCM region is formed on the scribe grid region, so that patterns of a wiring layer and an interlayer insulating film becomes complicated in the scribe grid region.

As a result, upon dicing a semiconductor wafer to divide each semiconductor element on the semiconductor wafer into individual semiconductor chips in a dicing step, a protection film or an interlayer insulating film suffers from chipping, internal separation or damage, resulting in reduction in yield of the semiconductor chip and deterioration in reliability of the semiconductor chip.

In order to solve the aforementioned problem, for example, there is proposed a semiconductor device illustrated in FIGS. 26, 27A and 27B. In this semiconductor device, a semiconductor wafer has the following structure. That is, a plurality of semiconductor element regions 12 and a plurality of scribe grid regions 13 are formed on a semiconductor substrate 11. In the respective semiconductor element regions 12 and scribe grid regions 13, hard interlayer insulating films 14 and soft insulating films 15 are laminated alternately and a protection film 14 is formed as an uppermost layer.

Then, a pair of seal rings 16 are formed in the scribe grid region 13 located between the semiconductor element regions 12, and a dicing region 17 is defined between the seal rings 16. The seal rings 16 make it possible to prevent the semiconductor element region 12 from occurrence of moisture intrusion, chipping and internal separation.

Each seal ring 16 is a thin metal wall for surrounding an outer periphery of the semiconductor element region 12, and is made of wiring metal, contact metal and the like.

On the other hand, JP2001-23937A discloses the following technique. Specifically, a plurality of integrated circuit chips are formed on a semiconductor wafer, and a crack propagation stopping part is provided in a seal region serving as a boundary between the integrated circuit chips. The crack propagation stopping part includes a continuous barrier wall, a sacrificial composite structure and a slot.

Further, JP2006-5288A discloses the following technique. Specifically, dummy vias are formed in respective layers of a dicing region. Herein, the dummy vias are formed at regular intervals in vertical and horizontal directions when being seen from above. With this configuration, even when cracking is occurred upon dicing, the dummy via prevents the cracking from propagating toward a seal ring.

However, due to advancement of a technique for finely defining a process rule in a diffusion process and advancement of a technique of planarization in the diffusion process, there arise the following problems that cannot be overcome by the aforementioned conventional techniques.

Specifically, a semiconductor wafer is planarized by CMP (Chemical Mechanical Polishing), so that an interlayer insulating film between wiring layers is reduced in thickness. Due to this planarization, frequencies of executing a step of forming a wiring layer and an interlayer insulating film are increased and, also, interlayer insulating films are increased in number. Consequently, a semiconductor wafer subjected to a diffusion process has a complicated configuration in regard to wiring layers and interlayer insulating films on a semiconductor substrate.

In addition, due to advancement of a technique for fine wiring in a diffusion process, a problem about wiring delay arising from increased inter-wiring capacitance becomes conspicuous. In order to suppress the wiring delay, an interlayer insulating film interposed between wiring layers is made of a low-k material (a low dielectric interlayer insulating film material) to achieve a low dielectric constant.

However, a film made of a low-k material is generally brittle and inferior in adhesiveness. Therefore, such a film is insufficient in mechanical strength as compared with a silicon oxide film adopted in a conventional semiconductor wafer. Consequently, internal separation is frequently occurred due to a damage upon dicing.

In light of the aforementioned disadvantages, it is difficult for the aforementioned conventional scribe grid structure to prevent a protection film and each wiring layer in a scribe grid region from occurrence of chipping, internal separation or damage upon dicing in a semiconductor device assembling process.

Conventionally, a seal ring is formed as a thin metal wall; however, if the metal wall is increased in thickness, a function of preventing the aforementioned internal separation or chipping can be enhanced.

However, since a seal ring is formed in a wiring forming step and a contact forming step in a diffusion process, a thickness thereof cannot be increased in terms of processing. Hence, internal separation or chipping must be prevented by a seal ring, which is a thin metal wall, upon dicing.

SUMMARY OF THE INVENTION

The present invention is made to solve the aforementioned problems. It is therefore an object of the present invention to provide a semiconductor device capable of preventing a protection film and each wiring layer in a scribe grid region from occurrence of internal separation, chipping or damage due to dicing.

In order to achieve this object, a semiconductor device according to the present invention comprises a semiconductor wafer including a plurality of semiconductor element regions each having a semiconductor circuit formed thereon and a scribe grid region interposed between the semiconductor element regions, wherein the scribe grid region has a boundary region adjacent to the semiconductor element region, the boundary region includes a seal section for separating the scribe grid region from the semiconductor element region, the seal section includes at least one main band and at least one sub band, the main band of the seal section is continuously formed along a boundary between the semiconductor element region and the scribe grid region, the sub band of the seal section is intermittently arranged along the main band, and the main band of the seal section is constituted by a metal layer.

In addition, the seal section is covered with an electrical insulating film.

In addition, the metal layer is made of one of copper, aluminum, tungsten, titanium, and tantalum, or a metal compound containing at least one of these copper, aluminum, tungsten, titanium, and tantalum.

In addition, the sub band of the seal section extends in one of a direction from the main band of the seal section toward the semiconductor element region and a direction from the main band of the seal section toward the scribe grid region.

In addition, the main band of the seal section surrounds an outer periphery of the semiconductor element region.

In addition, each of the main band and the sub band of the seal section is constituted by a metal layer.

In addition, the sub band of the seal section has a multilayer structure that a plurality of wiring layers and a plurality of insulating layers are laminated alternately and a plurality of vias are formed between the upper wiring layer and the lower wiring layer.

In addition, the seal section includes a plurality of main bands, and at least one of the main bands of the seal section has a multilayer structure that a plurality of wiring layers and a plurality of insulating layers are laminated alternately and a plurality of vias are formed between the upper wiring layer and the lower wiring layer.

In addition, the upper via and the lower via with the wiring layer interposed therebetween are located at different positions in a direction normal to the wiring layer.

According to the present invention, a seal section includes a main band continuously formed along a boundary between a semiconductor element region and a scribe grid region, and sub bands intermittently arranged along the main band. The main band of the seal section is constituted by a metal layer. Thus, it is possible to realize functional effects equal to those obtained by formation of a thick metal layer, with respect to an impact upon dicing of a semiconductor wafer. As a result, internal separation or chipping occurred in a dicing process can be prevented from propagation from a dicing line to a portion other than the dicing line.

According to the present invention, a sub band of a seal section extends in one of a direction from a main band of the seal section toward a semiconductor element region and a direction from the main band of the seal section toward a scribe grid region. Further, in a seal section, a part constituted by a metal layer and a part having a multilayer structure are used in combination. In the part having a multilayer structure, a plurality of wiring layers and a plurality of insulating layers are laminated alternately and a plurality of vias are formed between the upper wiring layer and the lower wiring layer. Thus, a protection film and an interlayer insulating layer provided between wiring layers in a scribe grid region can be prevented from occurrence of chipping, internal separation or damage with certainty. As a result, it is possible to provide a semiconductor device with improved reliability.

A seal section according to the present invention can be readily formed through a wiring forming step and a contact forming step in a diffusion process as in a manner for forming a conventional seal ring. In particular, each part in the seal section, constituted by a metal layer, can be formed only by a change in pattern without any change in procedures of a diffusing step and a dicing step.

DESCRIPTION OF THE PREFERRED EMBODIMENTS

Figure 1A:
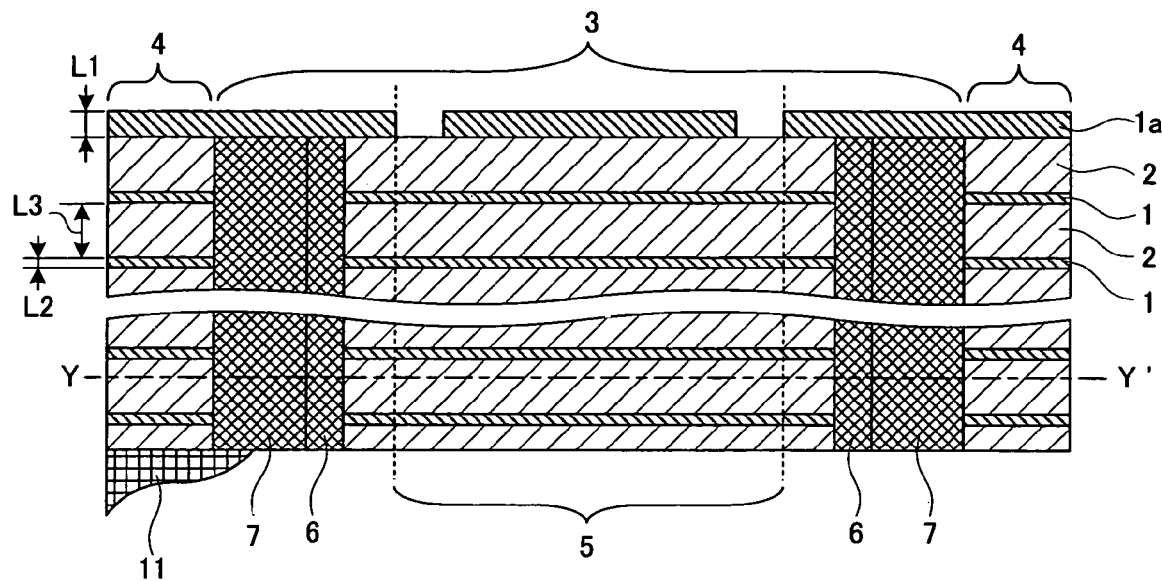
FIG. 1A is a sectional view illustrating a semiconductor wafer of a semiconductor device according to a first embodiment of the present invention after completion of a wiring step in a diffusion process.

Hereinafter, detailed description will be given of semiconductor devices according to preferred embodiments of the present invention with reference to the drawings. As illustrated in FIGS. 1A to 25B, a semiconductor device according to the present invention mainly includes a hard interlayer insulating film 1 made of a material other than a low-k material (a low dielectric interlayer insulating film material), a soft insulating film 2 made of a low-k material, a scribe grid region 3, a semiconductor element region 4, a PCM and dicing region 5, a first seal ring 6, a first auxiliary part 7, a second seal ring 8, and a second auxiliary part 9.

Each of the first seal ring 6, the second seal ring 8, the first auxiliary part 7 and the second auxiliary part 9 has a single-layer structure of a metal layer or a multilayer structure of a plurality of layers in some cases.

The metal layer is made of one of copper, aluminum, tungsten, titanium, and tantalum, or a metal compound containing at least one of these copper, aluminum, tungsten, titanium, and tantalum. A thickness and a line width of the metal layer are defined through a wiring forming step and a contact forming step in a diffusion process, therefore the values thereof differ for each diffusion process.

First Embodiment

Figure 1B:
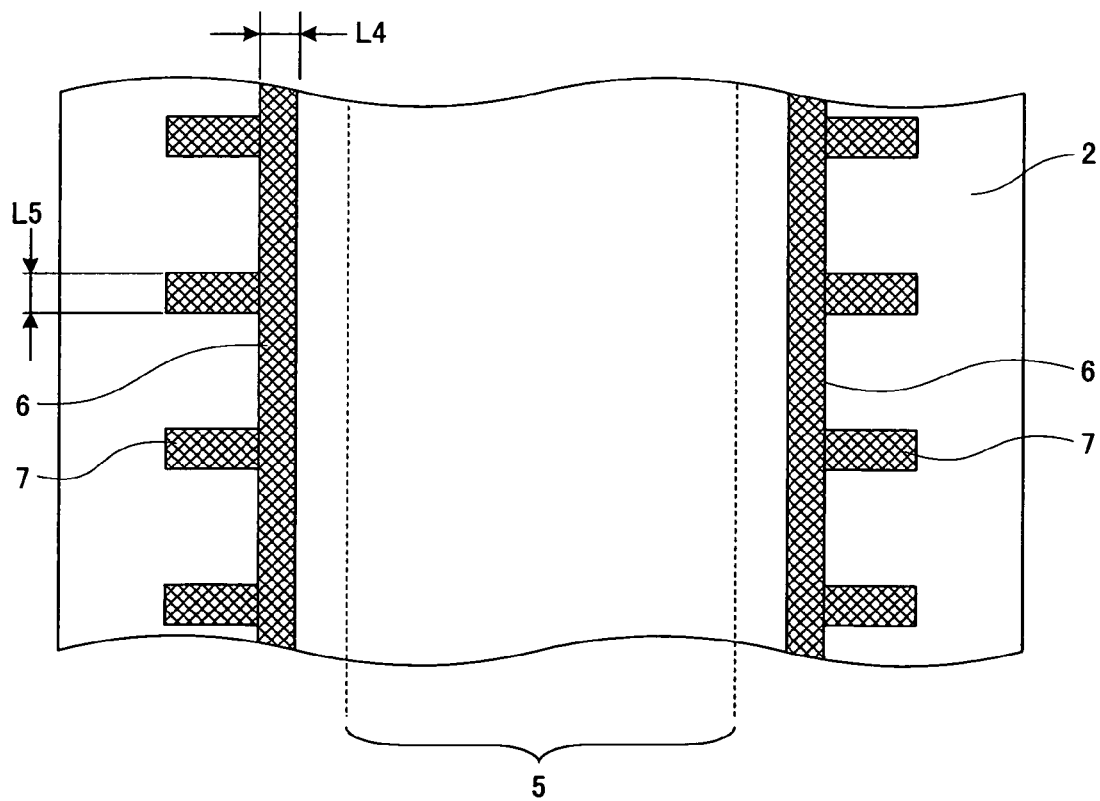
FIG. 1B is a sectional view taken along a line Y-Y' in FIG. 1A.

FIGS. 1A and 1B illustrate a structure of a semiconductor wafer of a semiconductor device according to a first embodiment of the present invention after completion of a wiring step in a diffusion process.

As illustrated in FIG. 1A, the semiconductor wafer has the following structure. That is, hard interlayer insulating films 1 and soft interlayer insulating films 2 are alternately laminated on a semiconductor substrate 11. A protection film (a passivation film) 1a is formed as an uppermost layer. Each interlayer insulating film 1 is made of wiring metal and contact metal (not illustrated).

The semiconductor wafer includes a plurality of semiconductor element regions 4, and a scribe grid region 3 interposed between the semiconductor element regions 4. A PCM and dicing region 5 is formed in the scribe grid region 3.

As illustrated in FIG. 1B, in the scribe grid region 3, seal sections are formed at both ends of the PCM and dicing region 5, that is, at boundary regions between the scribe grid region 3 and the semiconductor element region 4. Each seal section separates the scribe grid region 3 from the semiconductor element region 4, and has a periphery covered with the hard interlayer insulating film 1 and the soft insulating film 2.

The seal section includes a first seal ring 6 serving as a main band and a plurality of first auxiliary parts 7 each serving as an sub band. The first seal ring 6 serving as a main band is continuously formed along a boundary between the scribe grid region 3 and the semiconductor element region 4 so as to surround an outer periphery of the semiconductor element region 4. The plurality of first auxiliary parts 7 each serving as a sub band are formed intermittently at regular intervals and are arranged along the first seal ring 6. Each first auxiliary part 7 extends in a direction orthogonal to the first seal ring 6, that is, extends from the first seal ring 6 toward the semiconductor element region 4 to function as a retaining wall for the first seal ring 6.

The first seal ring 6 and the first auxiliary part 7 are formed throughout the plurality of interlayer insulating films 1 and the plurality of insulating films 2. In the first embodiment, the first seal ring 6 and the first auxiliary part 7 are constituted by a metal layer, respectively.

In the first embodiment, the protection film 1a has a thickness L1 in a range from 100 to 1200 nm, the interlayer insulating film 1 has a thickness L2 in a range from 20 to 80 nm, the insulating film 2 has a thickness L3 in a range from 200 to 700 nm, the first seal ring 6 has a thickness L4 in a range from 0.05 to 10 μm, and the first auxiliary part 7 has a thickness L5 in a range from 0.05 to 20 μm.

With this configuration, even when internal separation or chipping is occurred at the scribe grid region 3 upon dicing, the first seal ring 6 and the first auxiliary part 7 can prevent a portion other than the scribe grid region 3 from propagation of the internal separation or the chipping from a dicing line (in a vertical direction).

According to a conventional technique, an impact due to dicing must be received only by the first seal ring 6 constituted by a thin metal layer so as to prevent internal separation or chipping. However, according to the first embodiment, the plurality of first auxiliary parts 7 extend from the first seal ring 6 toward the semiconductor element region 4 to function as retaining walls for the first seal ring 6, so that the first embodiment can exhibit an effect equal to that exhibited by a seal ring constituted by a thick metal layer.

In addition, the seal section is formed in a wiring forming step and a contact forming step in a diffusion process as in a manner for forming a conventional seal ring. Therefore, the seal section can be readily formed only by a change in wiring formation pattern and contact formation pattern. Thus, it is possible to prevent a protection film and an interlayer insulating film in a scribe grid region from occurrence of chipping, internal separation or damage without any change in diffusing step and dicing step.

Second Embodiment

Figure 2A:
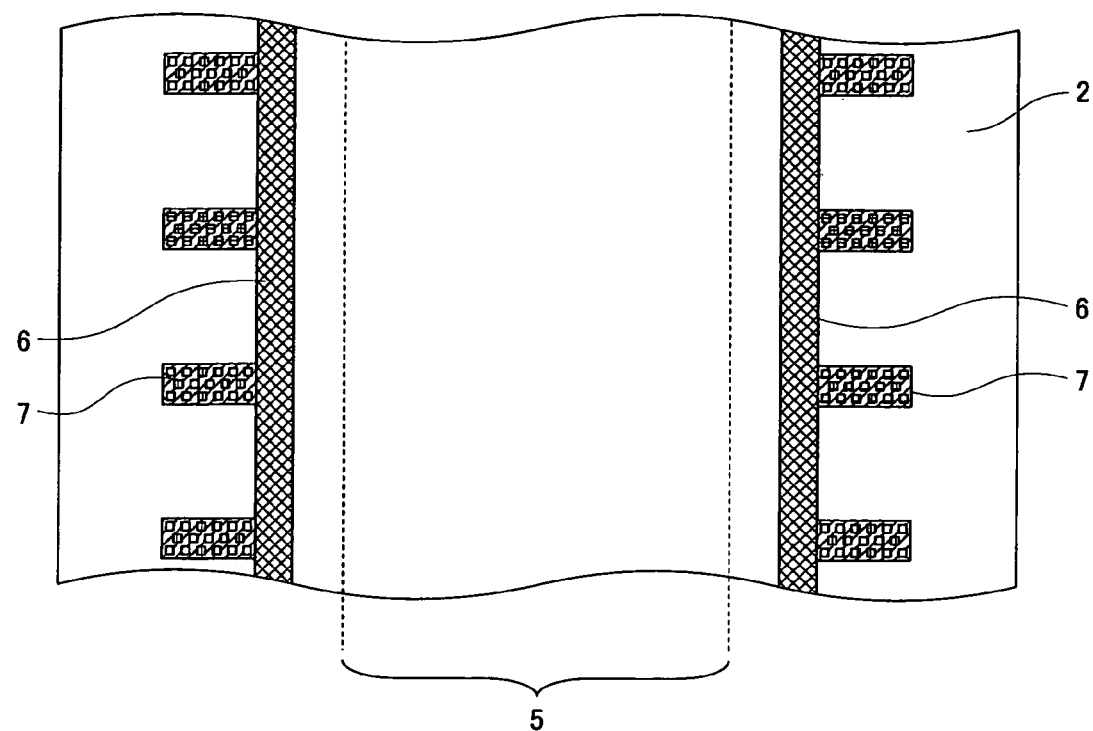
FIG. 2A is a sectional view illustrating a layout of a seal ring in a semiconductor wafer of a semiconductor device according to a second embodiment of the present invention after completion of a wiring step in a diffusion process.

In a second embodiment, as illustrated in FIG. 2A, each of a plurality of first auxiliary parts 7, serving as a sub band of a seal section, has a multilayer structure of a plurality of layers.

Figure 2B:
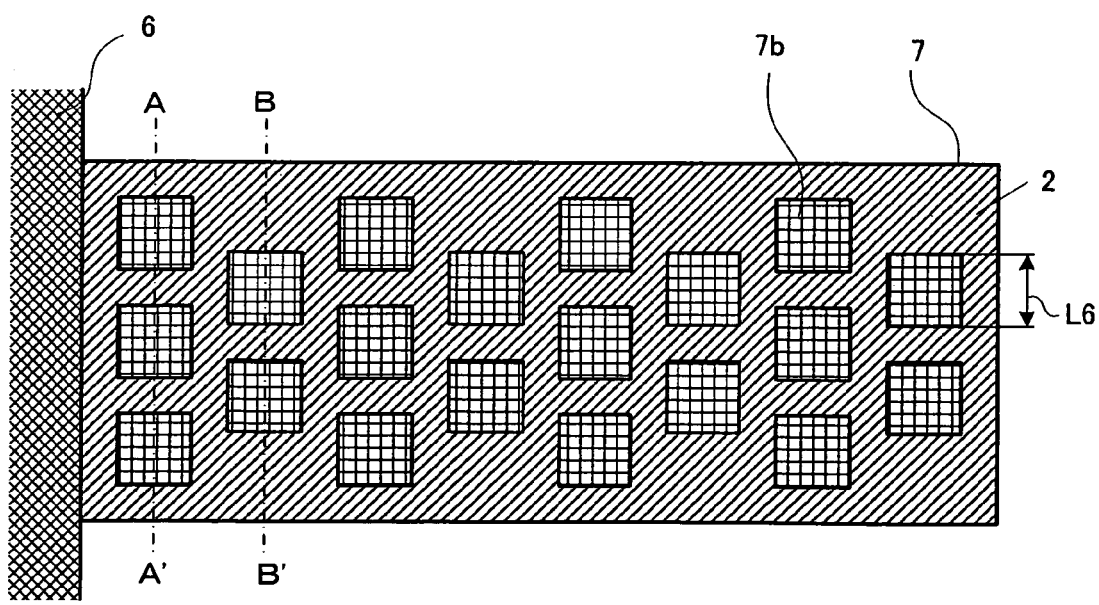
FIG. 2B is an enlarged sectional view illustrating an auxiliary part.
Figure 3A:
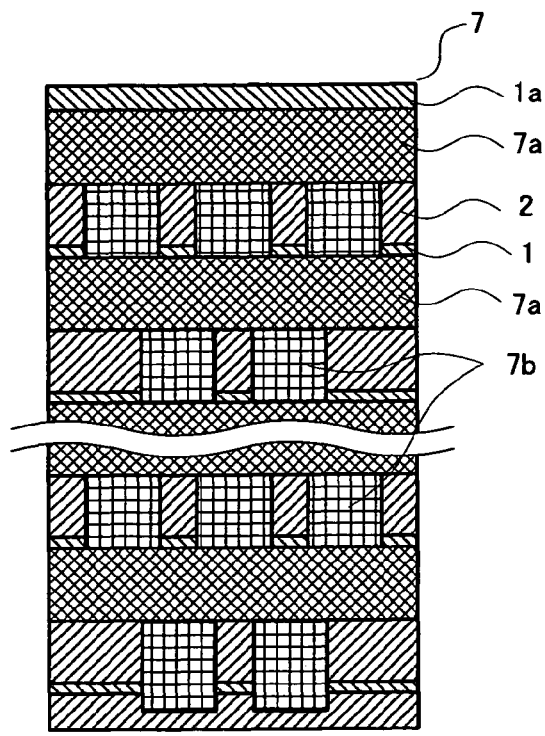
FIG. 3A is a sectional view taken along a line A-A' in FIG. 2B.
Figure 3B:
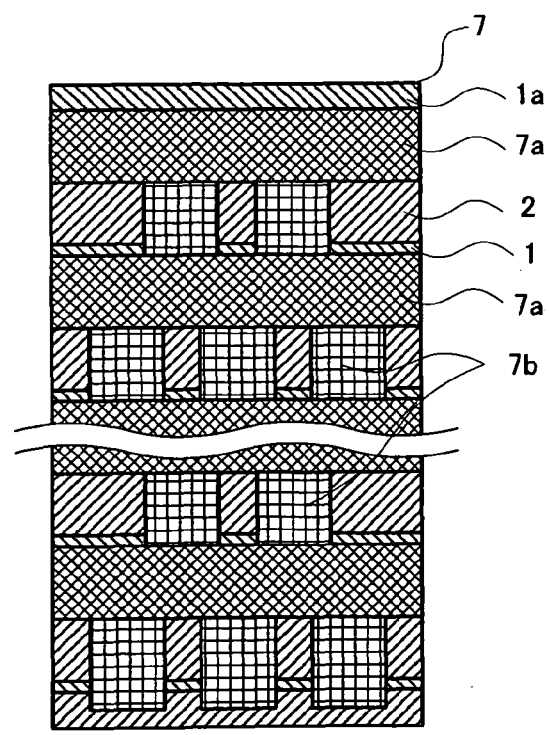
FIG. 3B is a sectional view taken along a line B-B' in FIG. 2B.

As illustrated in FIGS. 2B, 3A and 3B, the first auxiliary part 7 has a multilayer structure that a plurality of wiring layers 7a and a plurality of interlayer insulating layers 1 and insulating layers 2 are laminated alternately and a plurality of vias 7b are formed between the upper wiring layer 7a and the lower wiring layer 7a. Each via 7b is formed into a cubic shape or a cuboid shape with each side having a length L6 in a range from 0.05 to 1 μm. Each of the wiring layer 7a and the via 7b is constituted by a metal layer as in the first seal ring 6 described in the first embodiment.

The vias 7b are formed with a predetermined pattern between the wiring layers 7a. More specifically, as illustrated in FIG. 2B, when it is assumed that a direction along a first seal ring 6 is a column direction and a direction orthogonal to the first seal ring 6 is a row direction, the vias 7b adjoining to each other in the column direction are aligned and the vias 7b adjoining to each other in the row direction are misaligned.

Figure 4:
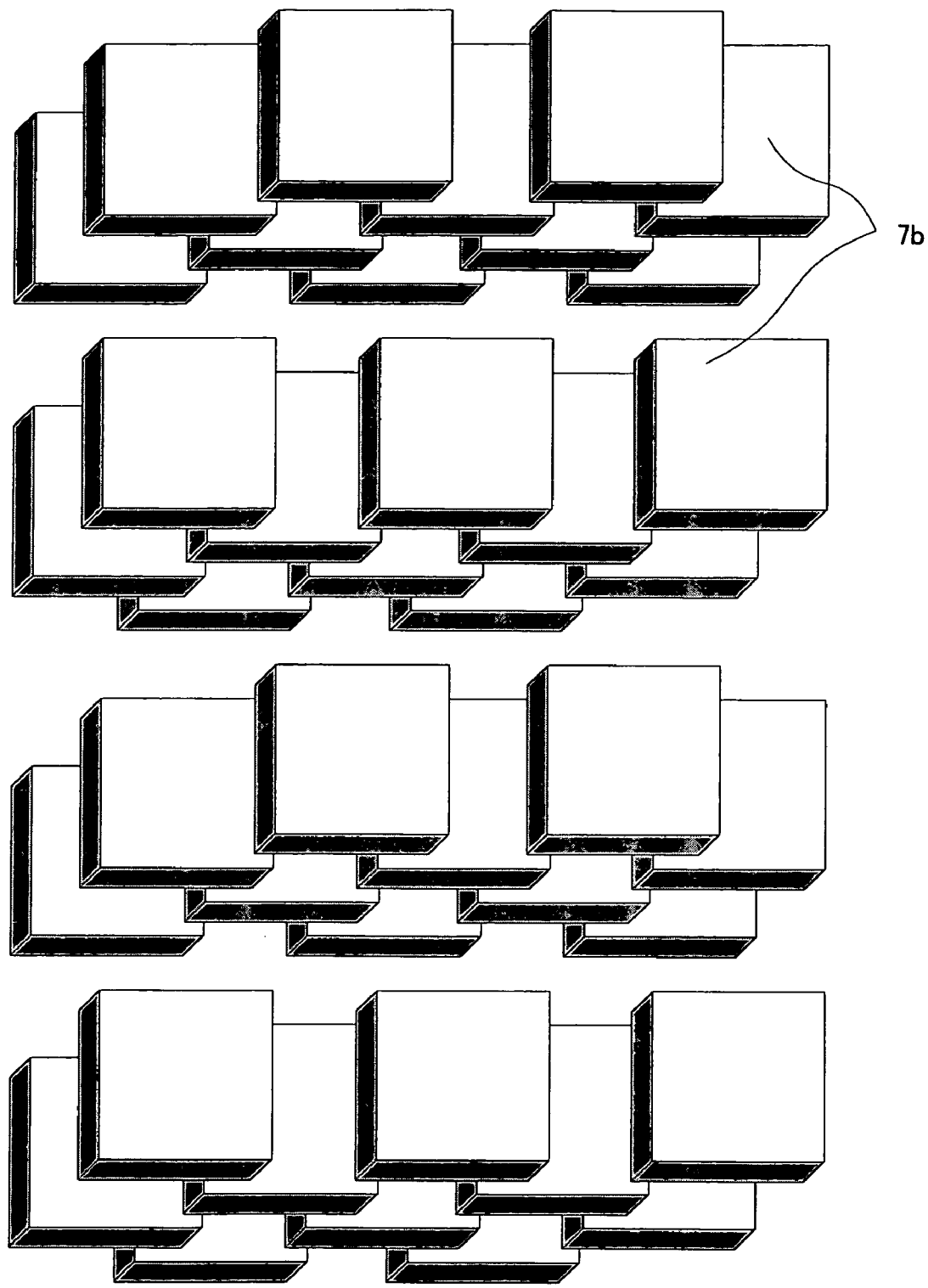
FIG. 4 is a perspective view illustrating a layout of a via.

As illustrated in FIGS. 3A and 3B, the upper via 7b and the lower via 7b with the wiring layer 7a interposed therebetween are located at different positions in a direction normal to the wiring layer 7a. FIG. 4 illustrates a general layout of the plurality of vias 7b in the first auxiliary part 7.

As described above, the seal section includes the first seal ring 6 having a single-layer structure of a metal layer and the first auxiliary part 7 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Third Embodiment

Figure 5A:
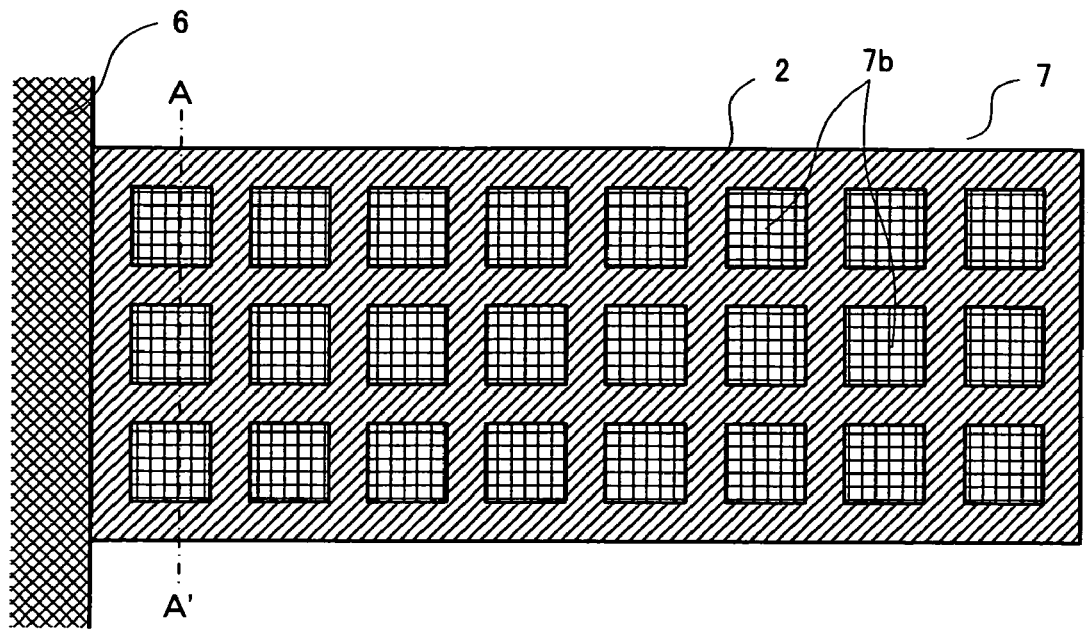
FIG. 5A is an enlarged sectional view illustrating an auxiliary part of a semiconductor device according to a third embodiment of the present invention.
Figure 5B:
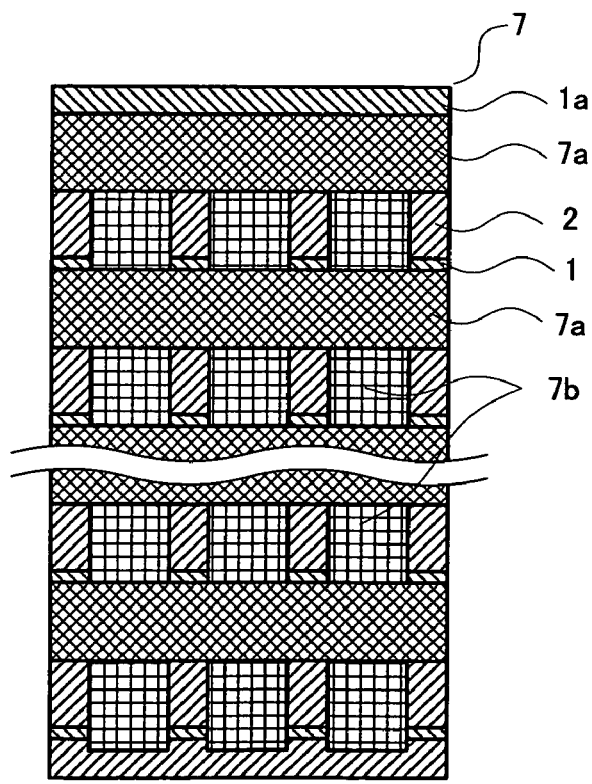
FIG. 5B is a sectional view taken along a line A-A' in FIG. 5A.
Figure 6:
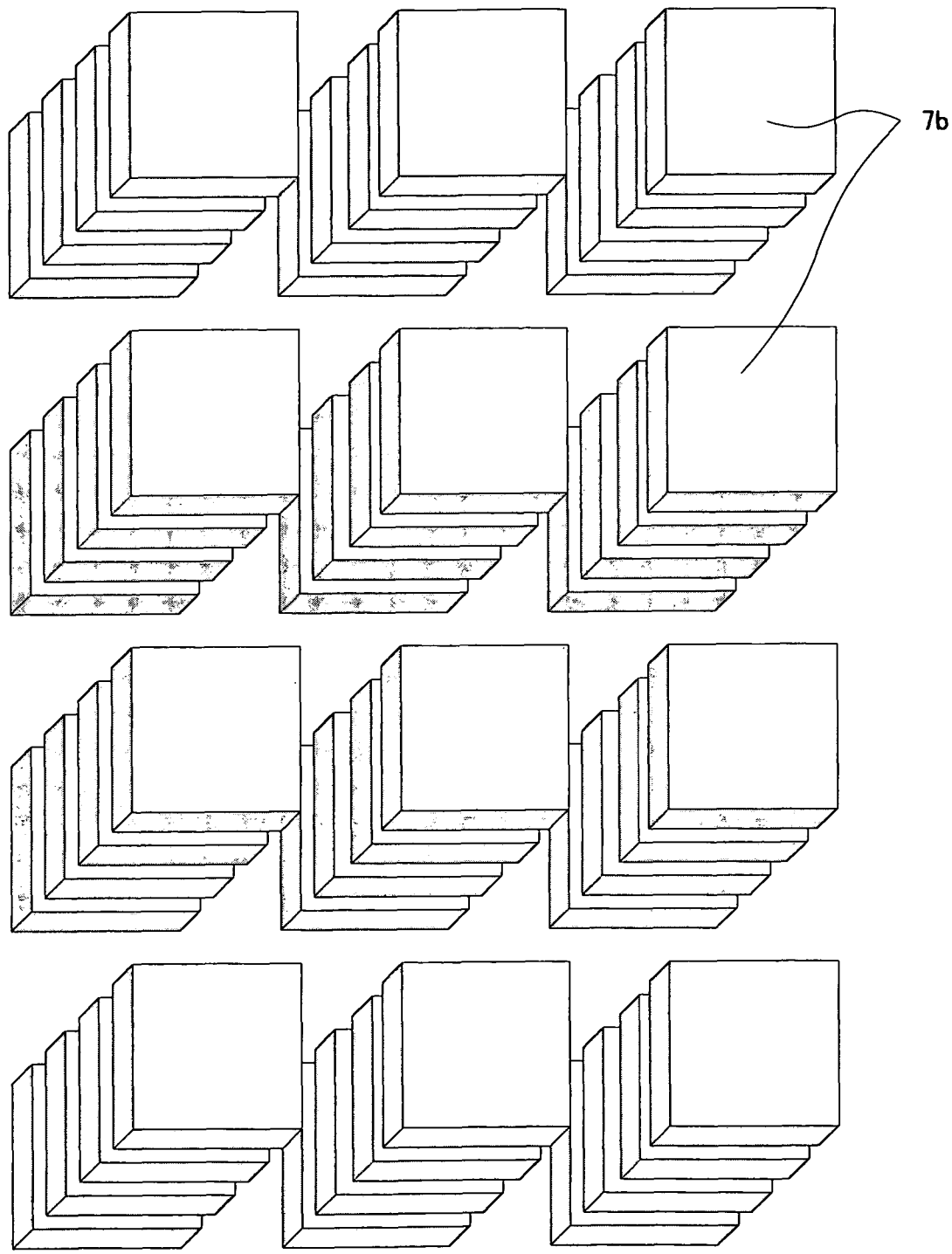
FIG. 6 is a perspective view illustrating a layout of a via.

A first auxiliary part 7 may have a multilayer structure illustrated in FIGS. 5A, 5B and 6. In a third embodiment, a first auxiliary part 7 has a multilayer structure that a plurality of wiring layers 7a and a plurality of interlayer insulating films 1 and insulating films 2 are laminated alternately and a plurality of vias 7b are formed between the upper wiring layer 7a and the lower wiring layer 7a. Each of the wiring layer 7a and the via 7b is constituted by a metal layer as in the first seal ring 6 described in the first embodiment.

The vias 7b are formed with a predetermined pattern between the wiring layers 7a. More specifically, as illustrated in FIG. 5A, when it is assumed that a direction along a first seal ring 6 is a column direction and a direction orthogonal to the first seal ring 6 is a row direction, the vias 7b are aligned in both the column direction and the row direction.

As illustrated in FIG. 5B, the upper via 7b and the lower via 7b with the wiring layer 7a interposed therebetween are aligned in a direction normal to the wiring layer 7a. FIG. 6 illustrates a general layout of the plurality of vias 7b in the first auxiliary part 7.

As described above, the seal section includes the first seal ring 6 having a single-layer structure of a metal layer and the first auxiliary part 7 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Fourth Embodiment

Figure 7A:
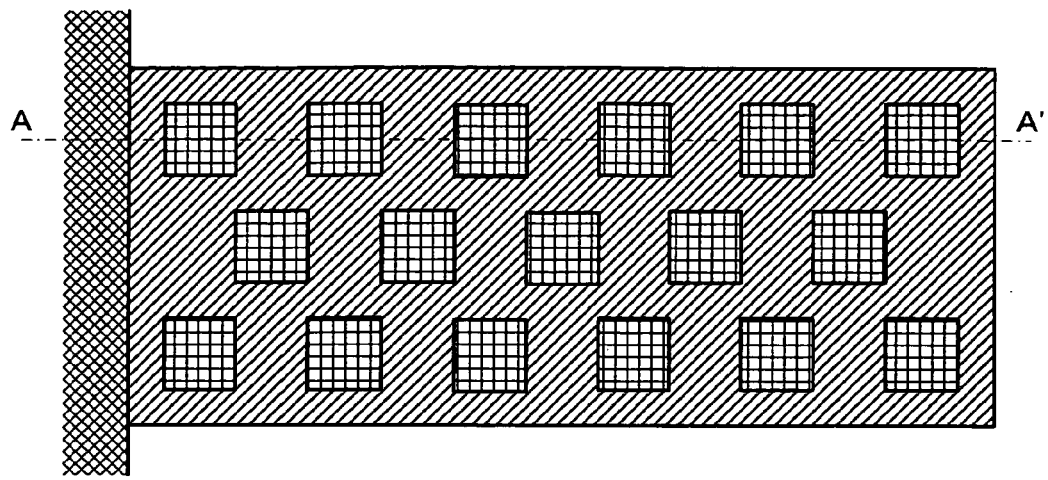
FIG. 7A is an enlarged sectional view illustrating an auxiliary part of a semiconductor device according to a fourth embodiment of the present invention.
Figure 7B:
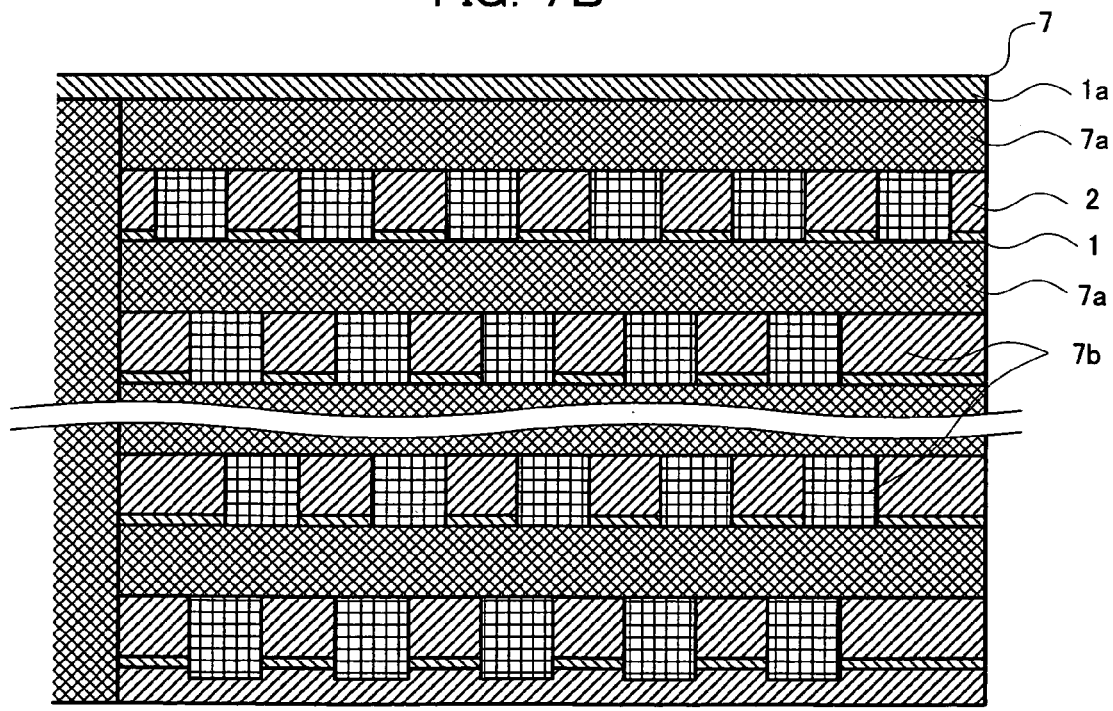
FIG. 7B is a sectional view taken along a line A-A' in FIG. 7A.
Figure 8:
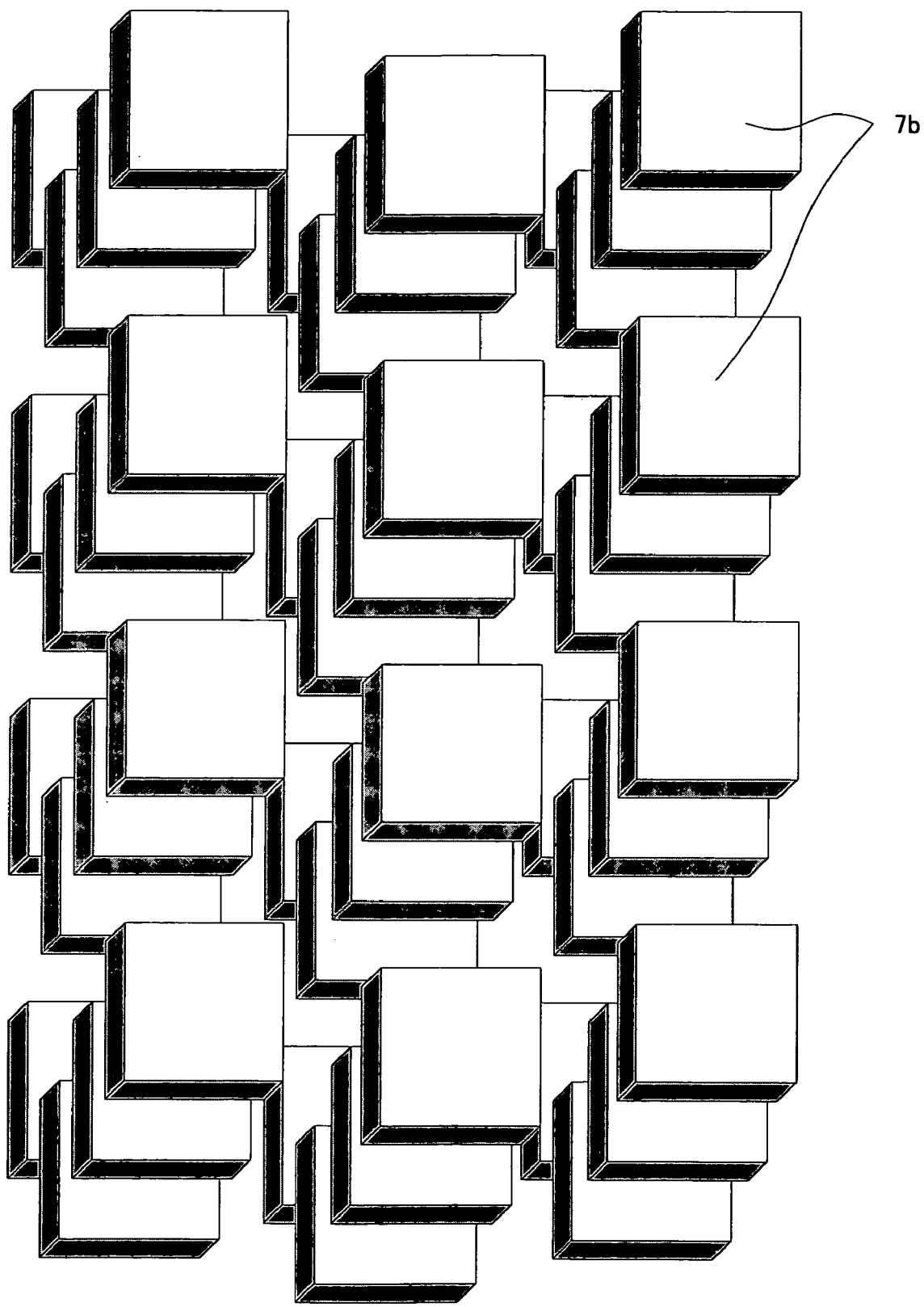
FIG. 8 is a perspective view illustrating a layout of a via.

A first auxiliary part 7 may have a multilayer structure illustrated in FIGS. 7A, 7B and 8. In a fourth embodiment, a first auxiliary part 7 has a multilayer structure that a plurality of wiring layers 7a and a plurality of interlayer insulating films 1 and insulating films 2 are laminated alternately and a plurality of vias 7b are formed between the upper wiring layer 7a and the lower wiring layer 7a. Each of the wiring layer 7a and the via 7b is constituted by a metal layer as in the first seal ring 6 described in the first embodiment.

The vias 7b are formed with a predetermined pattern between the wiring layers 7a. More specifically, as illustrated in FIG. 7A, when it is assumed that a direction along a first seal ring 6 is a column direction and a direction orthogonal to the first seal ring 6 is a row direction, the vias 7b adjoining to each other in the row direction are aligned and, from among adjoining rows, the vias 7b arranged in one of the rows and the vias 7b arranged in the other one of the rows are located at different positions in the column direction.

As illustrated in FIG. 7B, the upper via 7b and the lower via 7b with the wiring layer 7a interposed therebetween are misaligned in a direction normal to the wiring layer 7a. FIG. 8 illustrates a general layout of the plurality of vias 7b in the first auxiliary part 7.

As described above, the seal section includes the first seal ring 6 having a single-layer structure of a metal layer and the first auxiliary part 7 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Fifth Embodiment

Figure 9A:
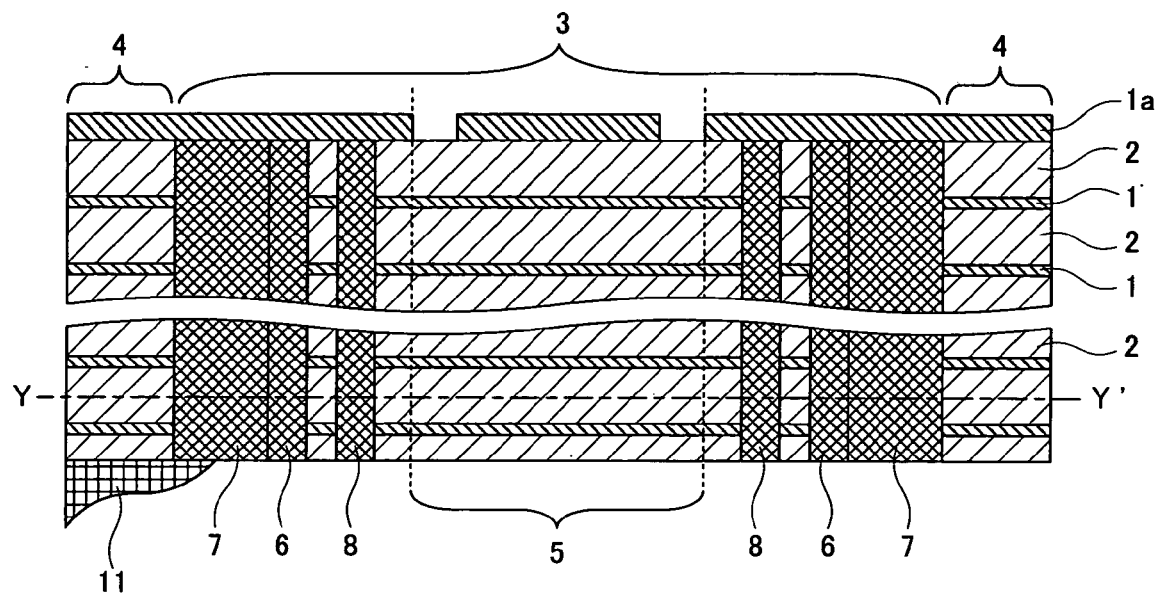
FIG. 9A is a sectional view illustrating a semiconductor wafer of a semiconductor device according to a fifth embodiment of the present invention after completion of a wiring step in a diffusion process.
Figure 9B:
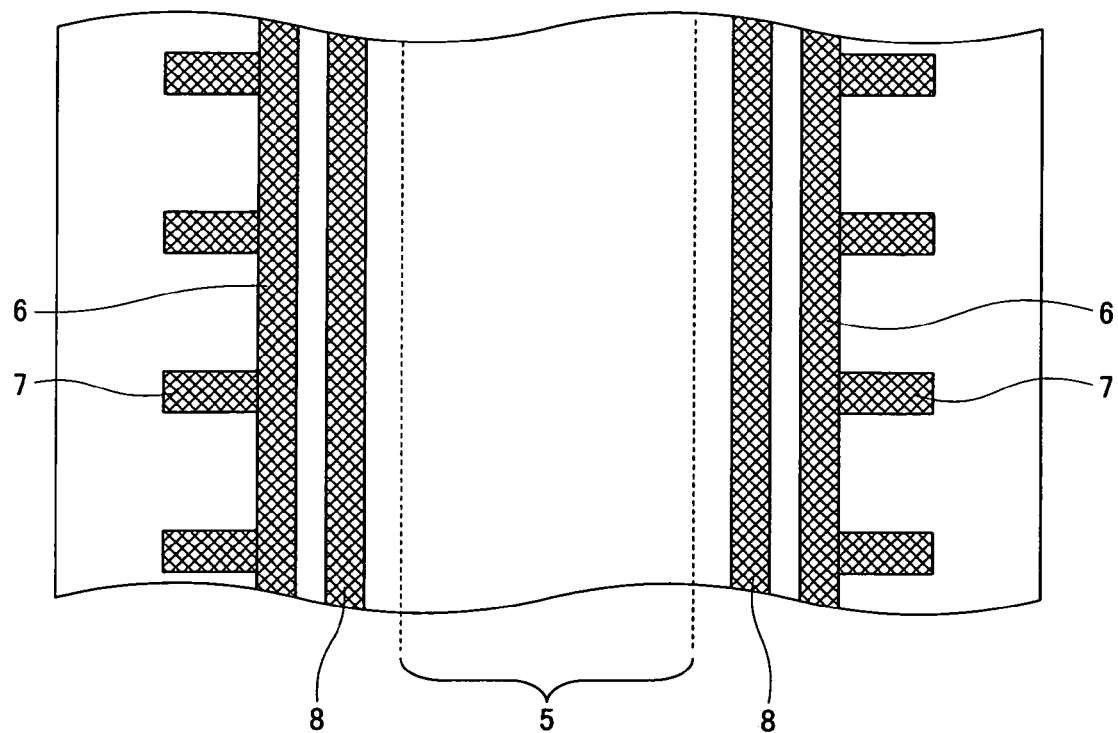
FIG. 9B is a sectional view taken along a line Y-Y' in FIG. 9A.

Next, FIGS. 9A and 9B illustrate a semiconductor device according to a fifth embodiment of the present invention. It is to be noted that similar components to those described with reference to FIGS. 1A and 1B are denoted by identical symbols; therefore, detailed description thereof will not be given here. In the fifth embodiment, as illustrated in FIG. 9A, a seal section is provided in a boundary region of a scribe grid region 3. The boundary region separates the scribe grid region 3 from a semiconductor element region 4. The seal section has a dual structure that a pair of first seal rings 6, each surrounding an outer periphery of the semiconductor element region 4 and serving as a main band, and a pair of second seal rings 8, each located at a position close to the scribe grid region 3 as compared with the first seal ring 6 and serving as a main band, are arranged in parallel. In the scribe grid region 3, a PCM and dicing region 5 is defined between the second seal rings 8.

As illustrated in FIG. 9B, a plurality of first auxiliary parts 7 each serving as a sub band are formed intermittently at regular intervals and are arranged along the first seal rings 6. Each first auxiliary part 7 extends in a direction orthogonal to the first seal ring 6, that is, extends from the first seal ring 6 toward the semiconductor element region 4, and functions as a retaining wall for the first seal ring 6.

Each of the first seal ring 6, the second seal ring 8 and the first auxiliary part 7 is formed throughout the plurality of interlayer insulating films 1 and the plurality of insulating films 2, and is made of wiring metal and contact metal. In the fifth embodiment, each of the first seal ring 6, the second seal ring 8 and the first auxiliary part 7 has a single-layer structure of a metal layer.

As described above, the seal section has a dual structure, so that the fifth embodiment exhibits functional effects similar to those in the first embodiment. Thus, it is possible to prevent internal separation or chipping with higher certainty.

Sixth Embodiment

Figure 10A:
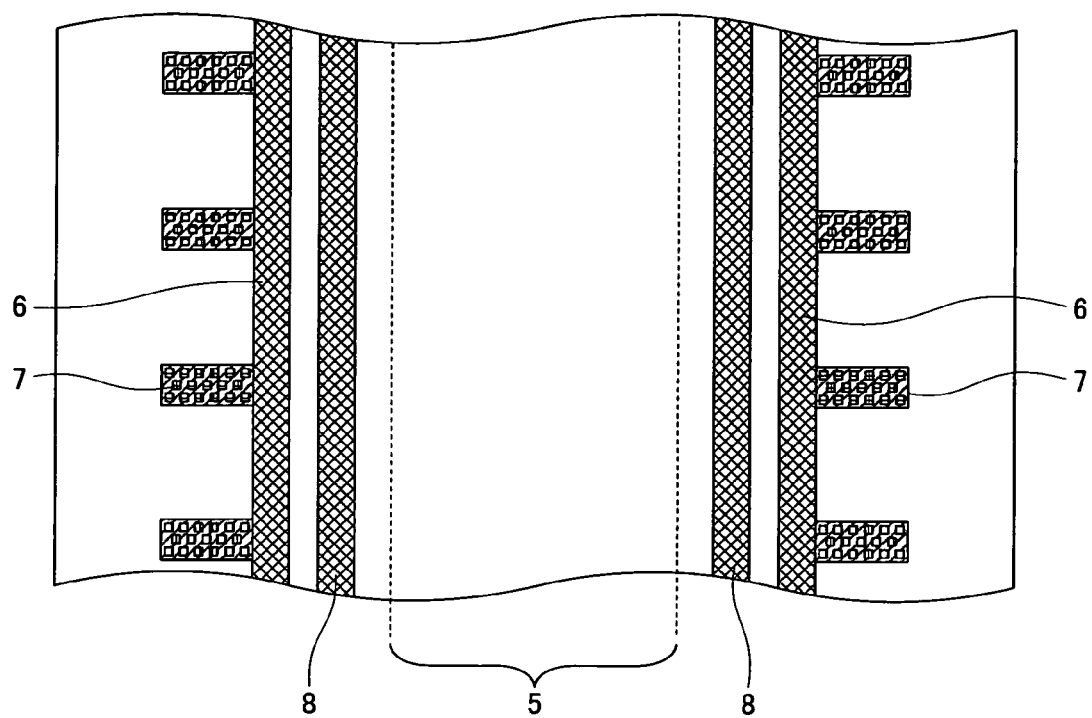
FIG. 10A is a sectional view illustrating a layout of a seal ring in a semiconductor wafer of a semiconductor device according to a sixth embodiment of the present invention after completion of a wiring step in a diffusion process.

In the fifth embodiment, each of the first sealing ring 6 serving as a main band of the seal section, the second seal ring 8 also serving as a main band of the seal section, and the first auxiliary part 7 serving as a sub band of the seal section has a single-layer structure of a metal layer. On the other hand, in a sixth embodiment, as illustrated in FIG. 10A, a first auxiliary part 7 has a multilayer structure of a plurality of layers. This multilayer structure may be equal to those described in the second, third and fourth embodiments.

As described above, a seal section includes the first seal ring 6 and the second seal ring 8 each constituted by a metal layer, and the first auxiliary part 7 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Seventh Embodiment

Figure 10B:
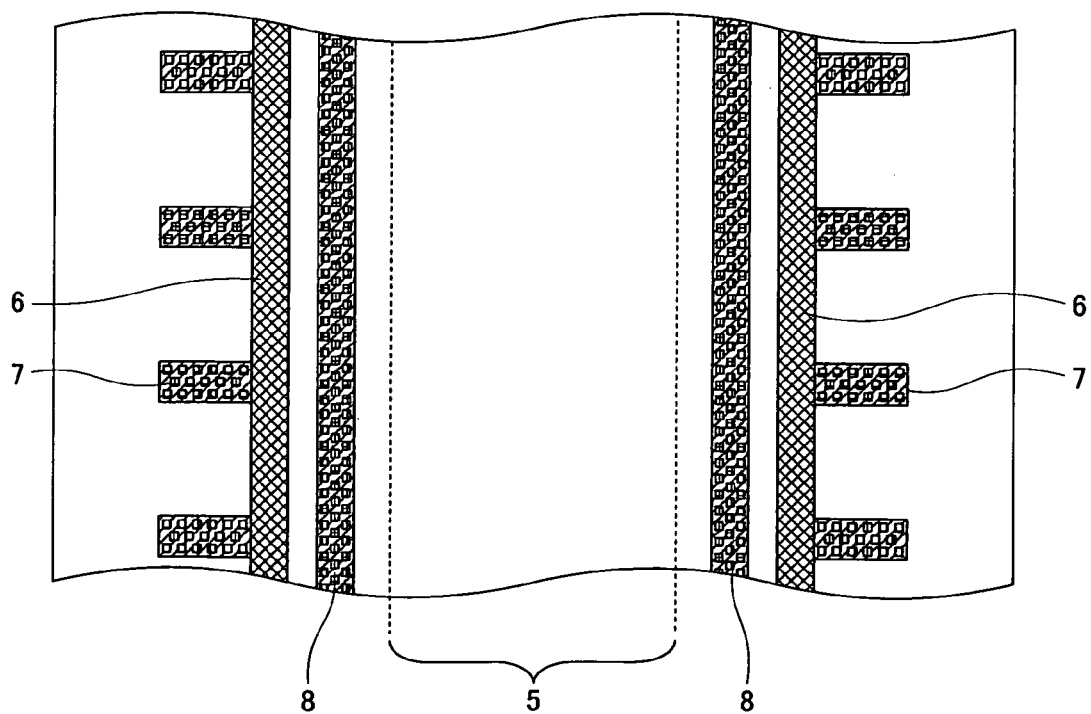
FIG. 10B is a sectional view illustrating a layout of a seal ring in a semiconductor wafer of a semiconductor device according to a seventh embodiment of the present invention after completion of a wiring step in a diffusion process.

In a seventh embodiment, as illustrated in FIG. 10B, a first seal ring 6 serving as a main band of a seal section has a single-layer structure of a metal layer, and each of a second seal ring 8 serving as a main band of the seal section and a first auxiliary part 7 serving as a sub band of the seal section has a multilayer structure of a plurality of layers. This multilayer structure may be equal to those described in the second, third and fourth embodiments.

As described above, the seal section includes the first seal ring 6 having a single-layer structure of a metal layer, and the second seal ring 8 and the first auxiliary part 7 each having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Eighth Embodiment

Figure 11A:
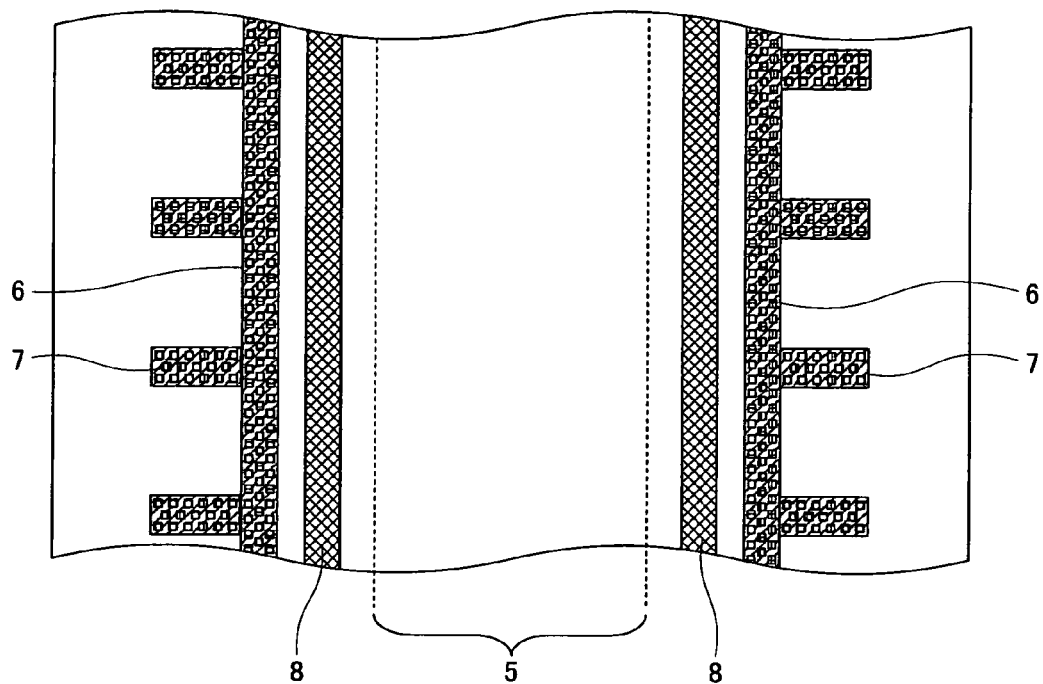
FIG. 11A is a sectional view illustrating a layout of a seal ring in a semiconductor wafer of a semiconductor device according to an eighth embodiment of the present invention after completion of a wiring step in a diffusion process.

In an eighth embodiment, as illustrated in FIG. 11A, a second seal ring 8 serving as a main band of a seal section has a single-layer structure of a metal layer, and each of a first seal ring 6 serving as a main band of the seal section and a first auxiliary part 7 serving as a sub band of the seal section has a multilayer structure of a plurality of layers. This multilayer structure may be equal to those described in the second, third and fourth embodiments.

As described above, the seal section includes the second seal ring 8 having a single-layer structure of a metal layer, and the first seal ring 6 and the first auxiliary part 7 each having a multilayer structure; thus, a protection film 1a and an interlayer insulating film 1 in a scribe grid region 3 can be prevented from occurrence of chipping, internal separation or

Ninth Embodiment

Figure 11B:
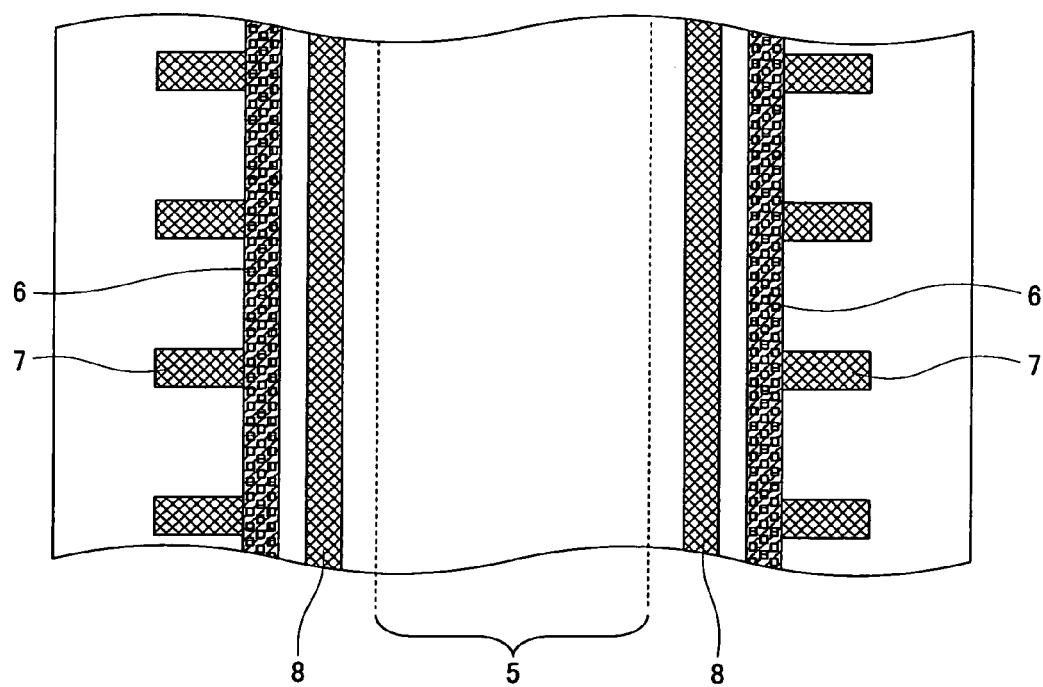
FIG. 11B is a sectional view illustrating a layout of a seal ring in a semiconductor wafer of a semiconductor device according to a ninth embodiment of the present invention after completion of a wiring step in a diffusion process.

In a ninth embodiment, as illustrated in FIG. 11B, each of a second seal ring 8 serving as a main band of a seal section and a first auxiliary part 7 serving as a sub band of the seal section has a single-layer structure of a metal layer, and a first seal ring 6 serving as a main band of the seal section has a multilayer structure of a plurality of layer. This multilayer structure may be equal to those described in the second, third and fourth embodiments.

As described above, the seal section includes the second seal ring 8 and the first auxiliary part 7 each having a single-layer structure of a metal layer, and the first seal ring 6 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Tenth Embodiment

Figure 12:
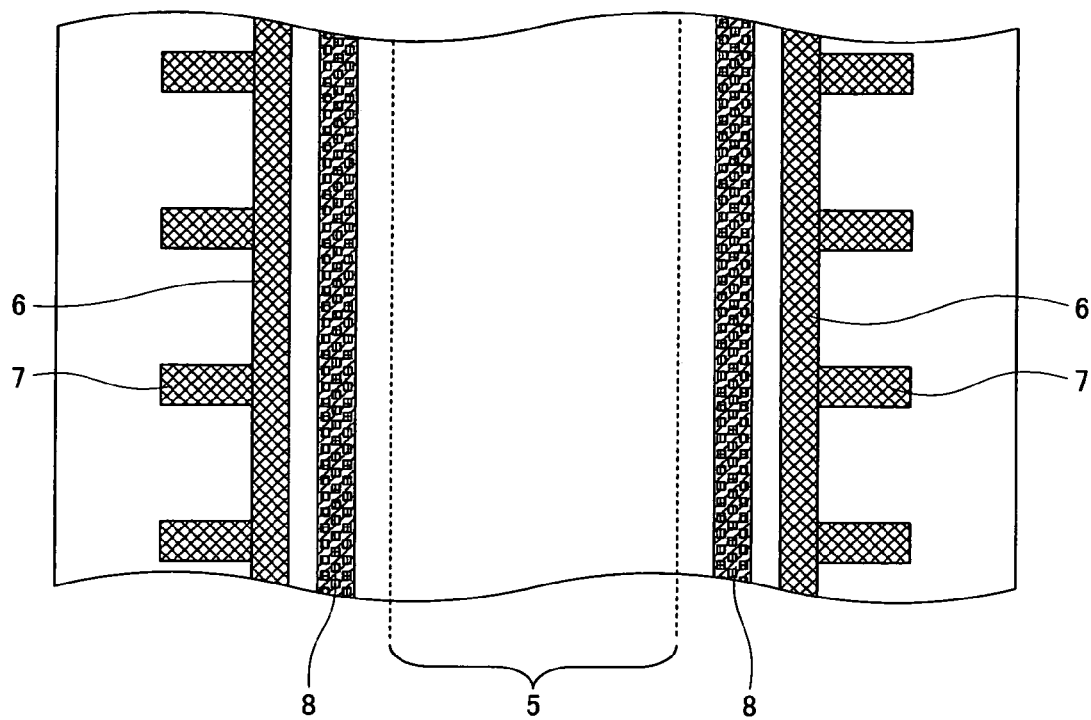
FIG. 12 is a sectional view illustrating a layout of a seal ring in a semiconductor wafer of a semiconductor device according to a tenth embodiment of the present invention after completion of a wiring step in a diffusion process.

In a tenth embodiment, as illustrated in FIG. 12, each of a first seal ring 6 serving as a main band of a seal section and a first auxiliary part 7 serving as a sub band of the seal section has a single-layer structure of a metal layer, and a second seal ring 8 serving as a main band of the seal section has a multilayer structure of a plurality of layers. This multilayer structure may be equal to those described in the second, third and fourth embodiments.

As described above, the seal section includes the first seal ring 6 and the first auxiliary part 7 each having a single-layer structure of a metal layer, and the second seal ring 8 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Eleventh Embodiment

Figure 13A:
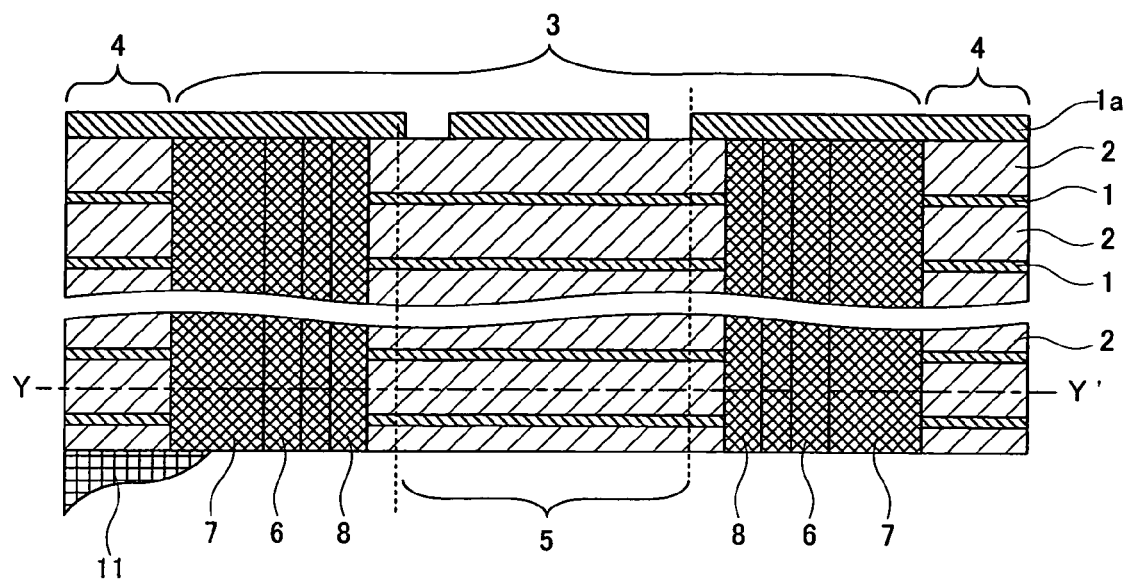
FIG. 13A is a sectional view illustrating a semiconductor wafer of a semiconductor device according to an eleventh embodiment of the present invention after completion of a wiring step in a diffusion process.
Figure 13B:
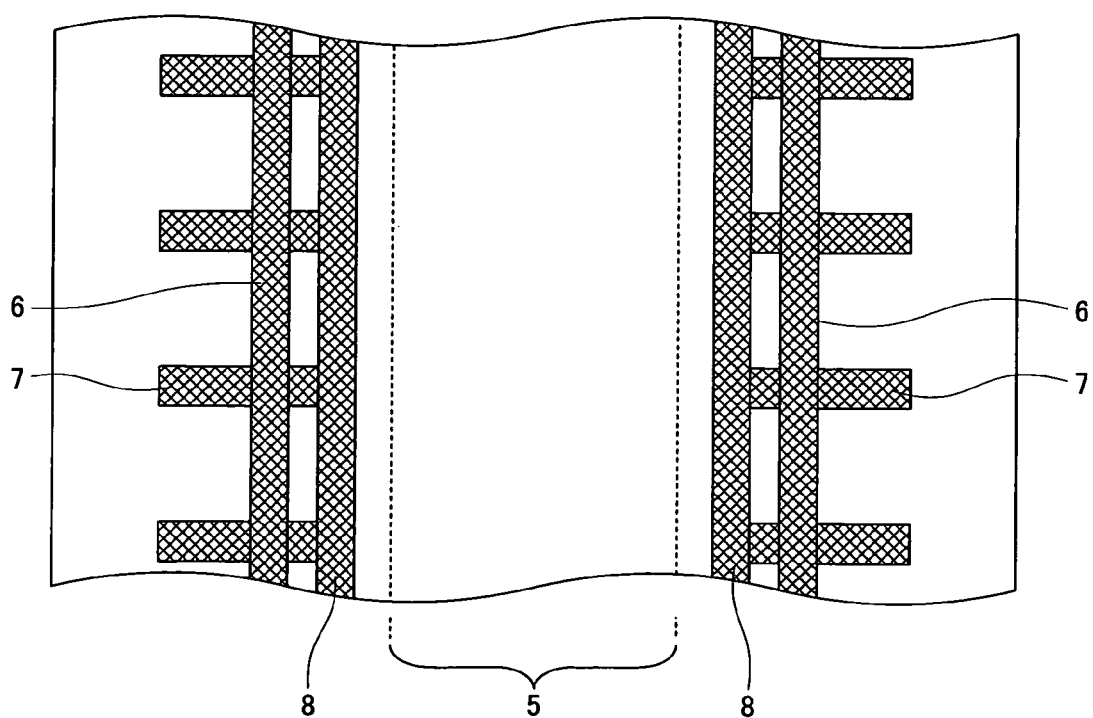
FIG. 13B is a sectional view taken along a line Y-Y' in FIG. 13A.

Next, FIGS. 13A and 13B illustrate a semiconductor device according to a eleventh embodiment of the present invention. It is to be noted that similar components to those described with reference to FIGS. 1A, 1B, 9A and 9B are denoted by identical symbols; therefore, detailed description thereof will not be given here.

In the eleventh embodiment, as illustrated in FIG. 13A, a seal section is provided at a boundary region in a scribe grid region 3. The boundary region separates the scribe grid region 3 from a semiconductor element region 4. The seal section has a dual structure that a pair of first seal rings 6, each surrounding an outer periphery of the semiconductor element region 4 and serving as a main band, and a pair of second seal rings 8, each located at a position close to the scribe grid region 3 as compared with the first seal ring 6 and serving as a main band, are arranged in parallel. In the scribe grid region 3, a PCM and dicing region 5 is defined between the second seal rings 8.

As illustrated in FIG. 13B, a plurality of first auxiliary parts 7 each serving as a sub band of a seal section are formed intermittently at regular intervals and are arranged along the first seal rings 6. Each first auxiliary part 7 extends in a direction orthogonal to the first seal ring 6, that is, extends from the first seal ring 6 toward both the semiconductor element region 4 and the PCM and dicing region 5. The first auxiliary part 7 has an end connected to the second seal ring 8 on a side of the PCM and dicing region 5, and functions as a retaining wall for the first seal ring 6 and the second seal ring 8.

Each of the first seal ring 6, the second seal ring 8 and the first auxiliary part 7 is formed throughout a plurality of interlayer insulating films 1 and a plurality of insulating films 2, and is made of wiring metal and contact metal. In the eleventh embodiment, each of the first seal ring 6, the second seal ring 8 and the first auxiliary part 7 has a single-layer structure of a metal layer.

As described above, the seal section has a dual structure, so that the eleventh embodiment exhibits functional effects similar to those in the first and fifth embodiments. In addition, the first auxiliary part 7 reaches the second seal ring 8. Thus, it is possible to prevent internal separation or chipping with higher certainty.

Twelfth Embodiment

Figure 14A:
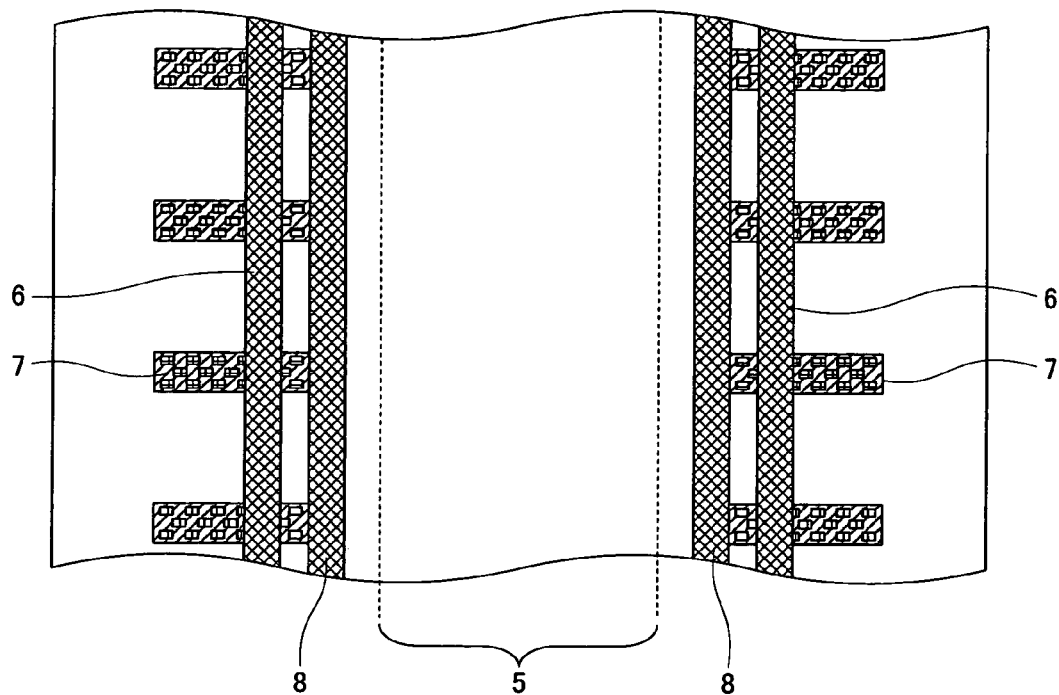
FIG. 14A is a sectional view illustrating a layout of a seal ring in a semiconductor wafer of a semiconductor device according to a twelfth embodiment of the present invention after completion of a wiring step in a diffusion process.

In the eleventh embodiment, each of the first seal ring 6 serving as a main band of the seal section, the second seal ring 8 also serving as a main band of the seal section, and the first auxiliary part 7 serving as a sub band of the seal section has a single-layer structure of a metal layer. On the other hand, in a twelfth embodiment, as illustrated in FIG. 14A, a first auxiliary part 7 has a multilayer structure of a plurality of layers. This multilayer structure may be equal to those described in the second, third and fourth embodiments.

As described above, a seal section includes a first seal ring 6 and a second seal ring 8 each having a single-layer structure of a metal layer, and the first auxiliary part 7 having a multilayer structure; thus, a protection film 1a and an interlayer insulating layer 1 in a scribe grid region 3 can be prevented from occurrence of chipping, internal separation or damage with higher certainty. As a result, it is possible to provide a semiconductor device with improved reliability.

Thirteenth Embodiment

Figure 14B:
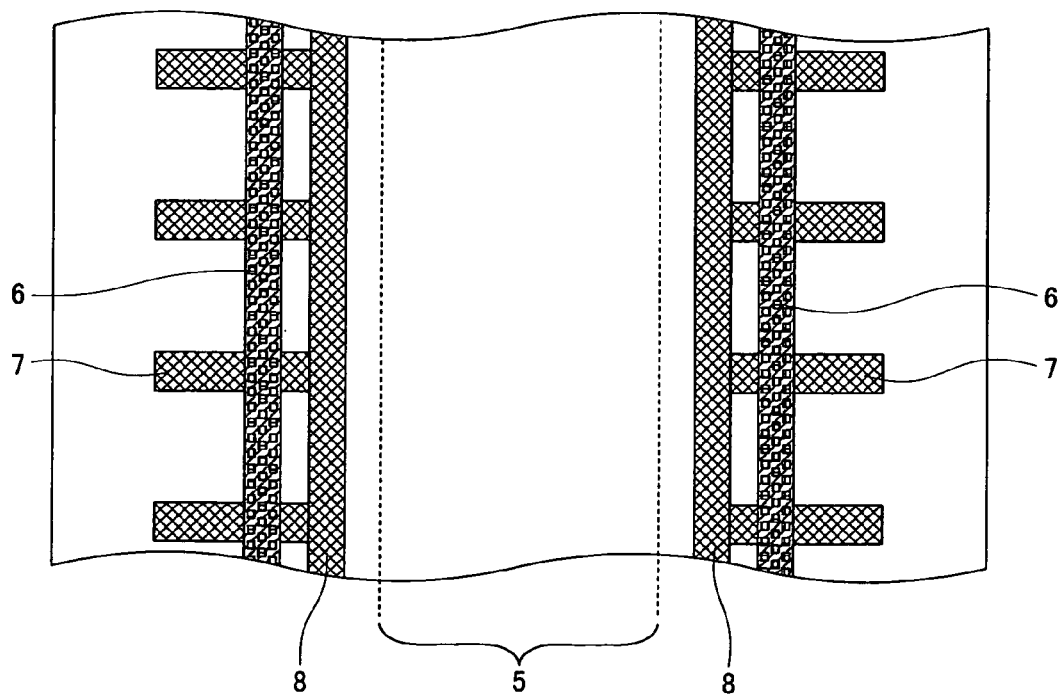
FIG. 14B is a sectional view illustrating a layout of a seal ring in a semiconductor wafer of a semiconductor device according to a thirteenth embodiment of the present invention after completion of a wiring step in a diffusion process.

In a thirteenth embodiment, as illustrated in FIG. 14B, each of a second seal ring 8 serving as a main band of a seal section and a first auxiliary part 7 serving as a sub band of the seal section has a single-layer structure of a metal layer, and a first seal ring 6 serving as a main band of the seal section has a multilayer structure of a plurality of layers. This multilayer structure may be equal to those described in the second, third and fourth embodiments.

As described above, the seal section includes the second seal ring 8 and the first auxiliary part 7 each having a single-layer structure of a metal layer, and the first seal ring 6 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Fourteenth Embodiment

Figure 15A:
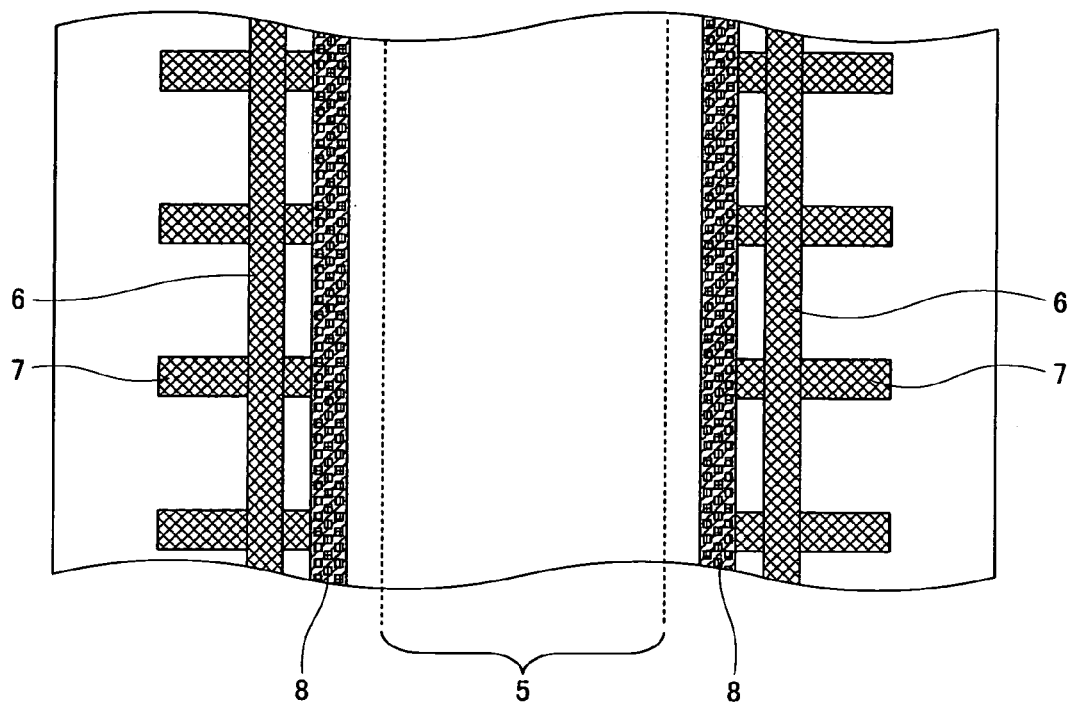
FIG. 15A is a sectional view illustrating a layout of a seal ring in a semiconductor wafer of a semiconductor device according to a fourteenth embodiment of the present invention after completion of a wiring step in a diffusion process.

In a fourteenth embodiment, as illustrated in FIG. 15A, each of a first seal ring 6 serving as a main band of a seal section and a first auxiliary part 7 serving as a sub band of the seal section has a single-layer structure of a metal layer, and a second seal ring 8 serving as a main band of the seal section has a multilayer structure of a plurality of layers. This multilayer structure may be equal to those described in the second, third and fourth embodiments.

As described above, the seal section includes the first seal ring 6 and the first auxiliary part 7 each having a single-layer structure of a metal layer, and the second seal ring 8 having a multilayer structure; thus, a protection film 1*a* and an interlayer insulating film 1 in a scribe grid region 3 can be prevented from occurrence of chipping, internal separation or damage with higher certainty. As a result, it is possible to provide a semiconductor device with improved reliability.

Fifteenth Embodiment

Figure 15B:
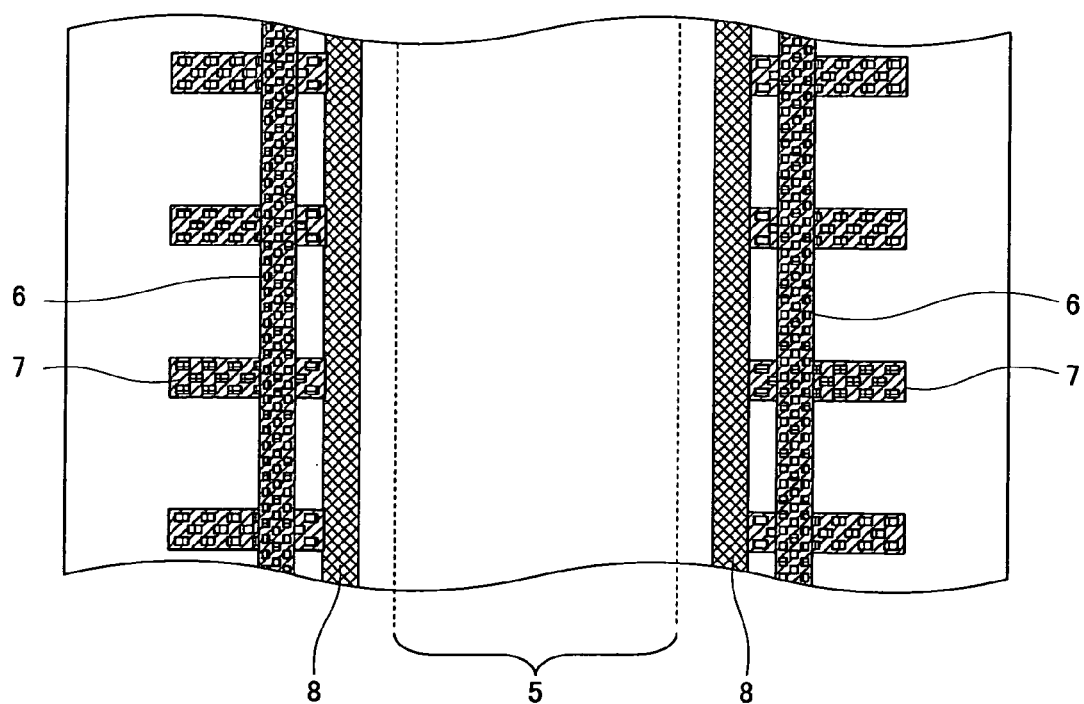
FIG. 15B is a sectional view illustrating a layout of a seal ring in a semiconductor wafer of a semiconductor device according to a fifteenth embodiment of the present invention after completion of a wiring step in a diffusion process.

In a fifteenth embodiment, as illustrated in FIG. 15B, a second seal ring 8 serving as a main band of a seal section has a single-layer structure of a metal layer, and each of a first seal ring 6 serving as a main band of the seal section and a first auxiliary part 7 serving as a sub band of the seal section has a multilayer structure of a plurality of layers. This multilayer structure may be equal to those described in the second, third and fourth embodiments.

As described above, the seal section includes the second seal ring 8 having a single-layer structure of a metal layer, and the first seal ring 6 and the first auxiliary part 7 each having the multilayer structure; thus, a protection film 1*a* and an interlayer insulating film 1 in a scribe grid region 3 can be prevented from occurrence of chipping, internal separation or damage with higher certainty. As a result, it is possible to provide a semiconductor device with improved reliability.

Sixteenth Embodiment

Figure 16:
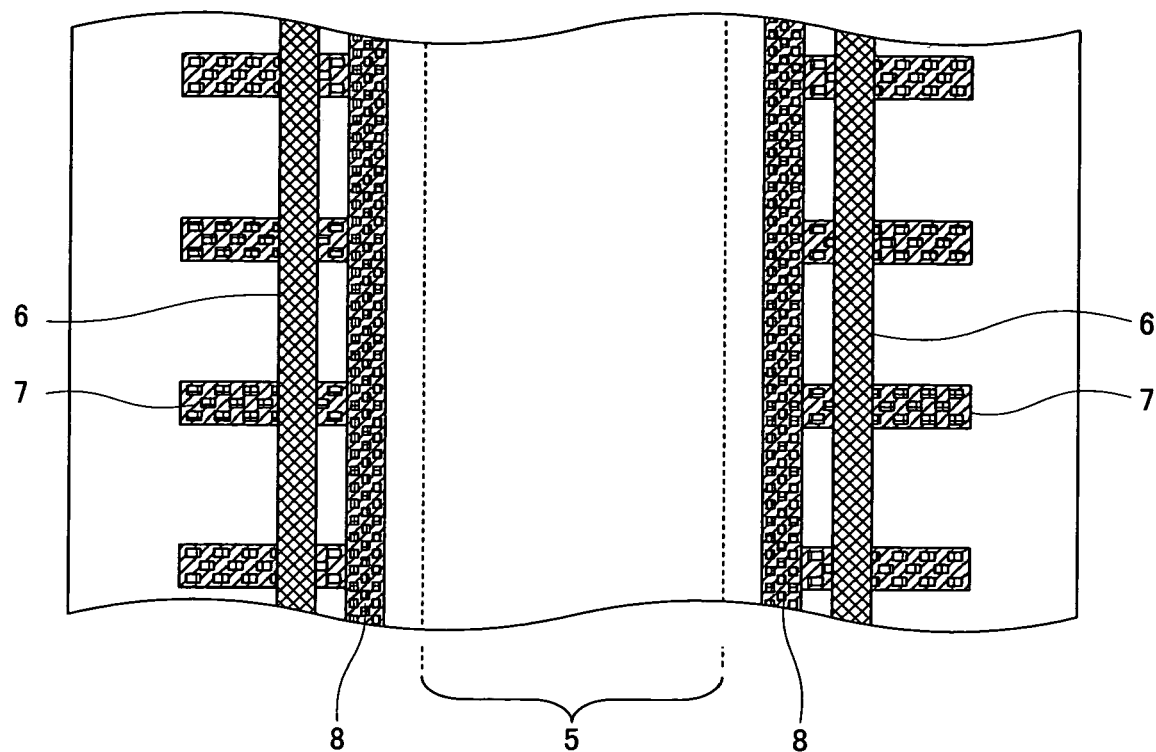
FIG. 16 is a sectional view illustrating a layout of a seal ring in a semiconductor wafer of a semiconductor device according to a sixteenth embodiment of the present invention after completion of a wiring step in a diffusion process.

In a sixteenth embodiment, as illustrated in FIG. 16, a first seal ring 6 serving as a main band of a seal section has a single-layer structure of a metal layer, and each of a second seal ring 8 serving as a main band of the seal section and a first auxiliary part 7 serving as a sub band of the seal section has a multilayer structure of a plurality of layers. This multilayer structure may be equal to those described in the second, third and fourth embodiments.

As described above, the seal section includes the first seal ring 6 having a single-layer structure of a metal layer, and the second seal ring 8 and the first auxiliary part 7 each having a multilayer structure; thus, a protection film 1*a* and an interlayer insulating film 1 in a scribe grid region 3 can be prevented from occurrence of chipping, internal separation or damage with higher certainty. As a result, it is possible to provide a semiconductor device with improved reliability.

Seventeenth Embodiment

Figure 17A:
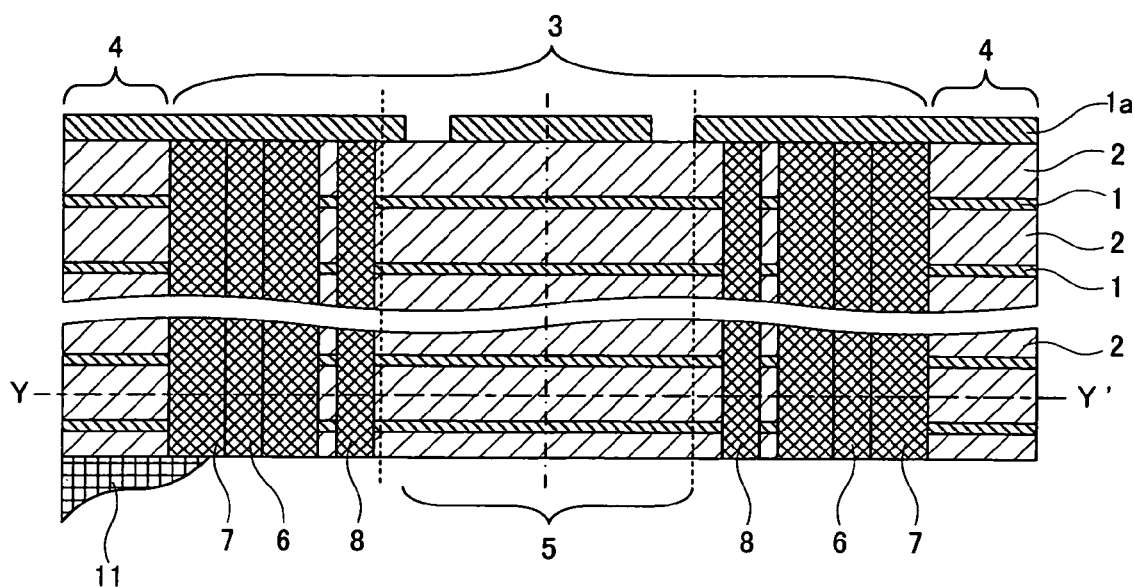
FIG. 17A is a sectional view illustrating a semiconductor wafer of a semiconductor device according to a seventeenth embodiment of the present invention after completion of a wiring step in a diffusion process.
Figure 17B:
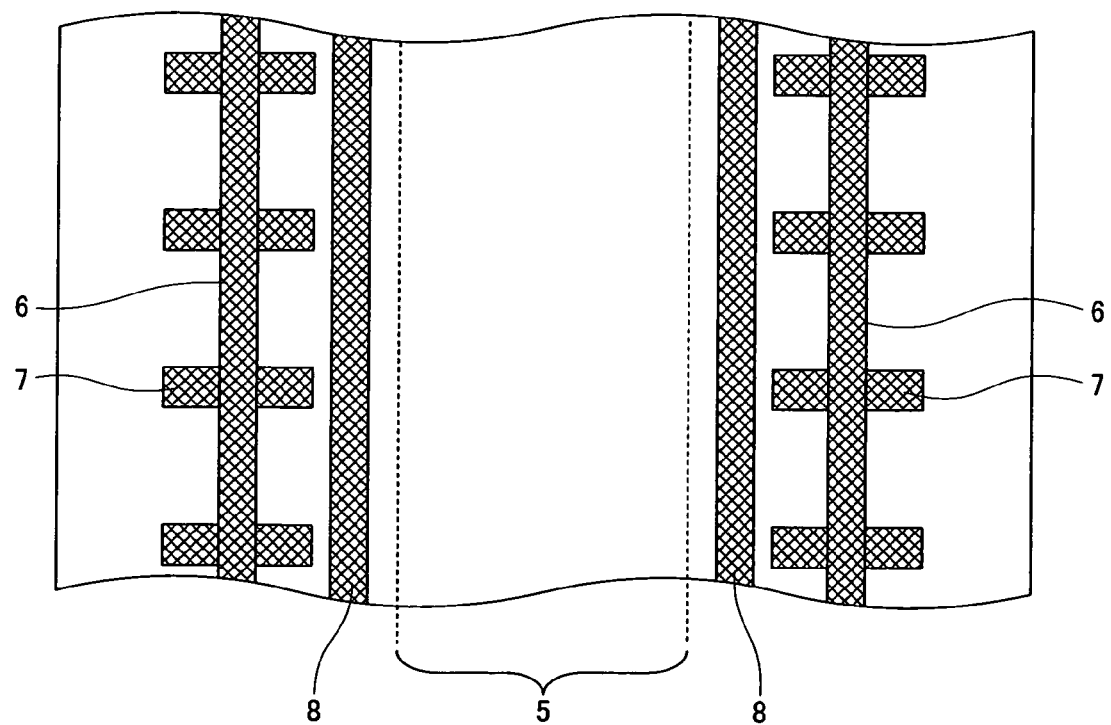
FIG. 17B is a sectional view taken along a line Y-Y' in FIG. 17A.

Next, FIGS. 17A and 17B illustrate a semiconductor device according to a seventeenth embodiment of the present invention. It is to be noted that similar components to those described with reference to FIGS. 1A, 1B, 9A and 9B are denoted by identical symbols; therefore, detailed description thereof will not be given here.

In the seventeenth embodiment, as illustrated in FIG. 17A, a seal section is provided at a boundary region in a scribe grid region 3. The boundary region separates the scribe grid region 3 from a semiconductor element region 4. The seal section has a dual structure that a pair of first seal rings 6, each surrounding an outer periphery of the semiconductor element region 4 and serving as a main band, and a pair of second seal rings 8, each located at a position close to the scribe grid region 3 as compared with the first seal ring 6 and serving as a main band, are arranged in parallel. In the scribe grid region 3, a PCM and dicing region 5 is defined between the second seal rings 8.

As illustrated in FIG. 17B, a plurality of first auxiliary parts 7 each serving as a sub band are formed intermittently at regular intervals and are arranged along the first seal rings 6. Each first auxiliary part 7 extends in a direction orthogonal to the first seal ring 6, that is, extends from the first seal ring 6 toward both the semiconductor element region 4 and the PCM and dicing region 5. The first auxiliary part 7 has an end extending at a position very close the second seal ring 8 on a side of the PCM and dicing region 5, and functions as a retaining wall for the first seal ring 6 and the second seal ring 8.

Each of the first seal ring 6, the second seal ring 8 and the first auxiliary part 7 is formed throughout a plurality of interlayer insulating films 1 and a plurality of insulating films 2, and is made of wiring metal and contact metal. In the sixteenth embodiment, each of the first seal ring 6, the second seal ring 8 and the first auxiliary part 7 has a single-layer structure of a metal layer.

As described above, the seal section has a dual structure and the first auxiliary part 7 extends at a position very close to the second seal ring 8, so that the seventeenth embodiment exhibits functional effects similar to those in the first, fifth and eleventh embodiments. Thus, it is possible to prevent internal separation or chipping with higher certainty.

Eighteenth Embodiment

Figure 18A:
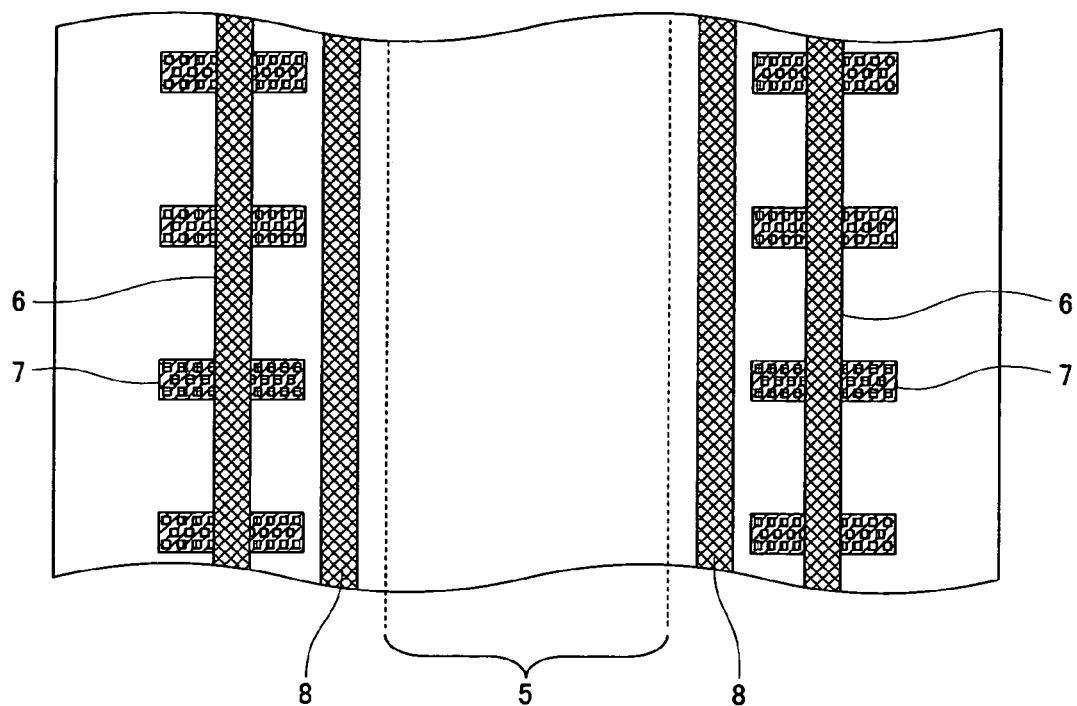
FIG. 18A is a sectional view illustrating a layout of a seal ring in a semiconductor wafer of a semiconductor device according to an eighteenth embodiment of the present invention after completion of a wiring step in a diffusion process.

In the seventeenth embodiment, each of the first seal ring 6 serving as a main band of the seal section, the second seal ring 8 also serving as a main band of the seal section, and the first auxiliary part 7 serving as a sub band of the seal section has a single-layer structure of a metal layer. On the other hand, in an eighteenth embodiment, as illustrated in FIG. 18A, a first auxiliary part 7 has a multilayer structure of a plurality of layers. This multilayer structure may be equal to those described in the second, third and fourth embodiments.

As described above, a seal section includes a first seal ring 6 and a second seal ring 8 each having a single-layer structure of a metal layer, and the first auxiliary part 7 having a multilayer structure; thus, a protection film 1*a* and an interlayer insulating film 1 in a scribe grid region 3 can be prevented from occurrence of chipping, internal separation or damage with higher certainty. As a result, it is possible to provide a semiconductor device with improved reliability.

Nineteenth Embodiment

Figure 18B:
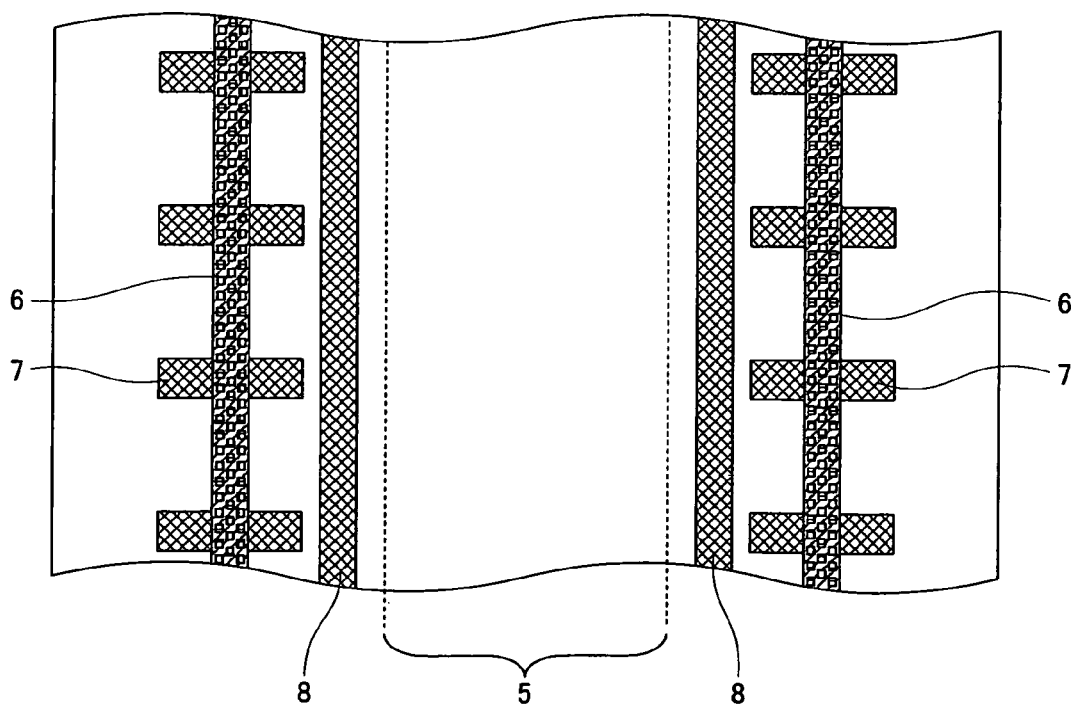
FIG. 18B is a sectional view illustrating a layout of a seal ring in a semiconductor wafer of a semiconductor device according to a nineteenth embodiment of the present invention after completion of a wiring step in a diffusion process.

In a nineteenth embodiment, as illustrated in FIG. 18B, each of a second seal ring 8 serving as a main band of a seal section and a first auxiliary part 7 serving as a sub band of the seal section has a single-layer structure of a metal layer, and a first seal ring 6 has a multilayer structure of a plurality of layers. This multilayer structure may be equal to those described in the second, third and fourth embodiments.

As described above, the seal section includes the second seal ring 8 and the first auxiliary part 7 each having a single-layer structure of a metal layer, and the first seal ring 6 having a multilayer structure; thus, a protection film 1*a* and an interlayer insulating film 1 in a scribe grid region 3 can be prevented from occurrence of chipping, internal separation or damage with higher certainty. As a result, it is possible to provide a semiconductor device with improved reliability.

Twentieth Embodiment

Figure 19A:
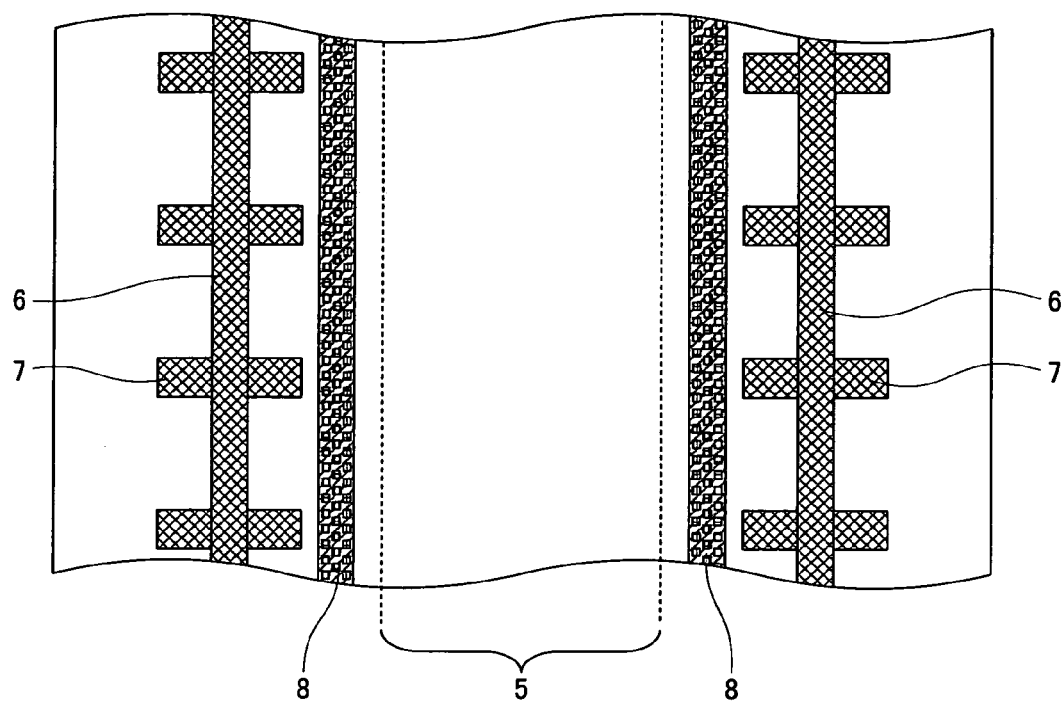
FIG. 19A is a sectional view illustrating a layout of a seal ring in a semiconductor wafer of a semiconductor device according to a twentieth embodiment of the present invention after completion of a wiring step in a diffusion process.

In a twentieth embodiment, as illustrated in FIG. 19A, each of a first seal ring 6 serving as a main band of a seal section and a first auxiliary part 7 serving as a sub band of the seal ring has a single-layer structure of a metal layer, and a second seal ring 8 serving as a main band of the seal section has a multilayer structure of a plurality of layers. This multilayer structure may be equal to those described in the second, third and fourth embodiments.

As described above, the seal section includes the first seal ring 6 and the first auxiliary part 7 each having a single-layer structure of a metal layer, and the second seal ring 8 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Twenty-First Embodiment

Figure 19B:
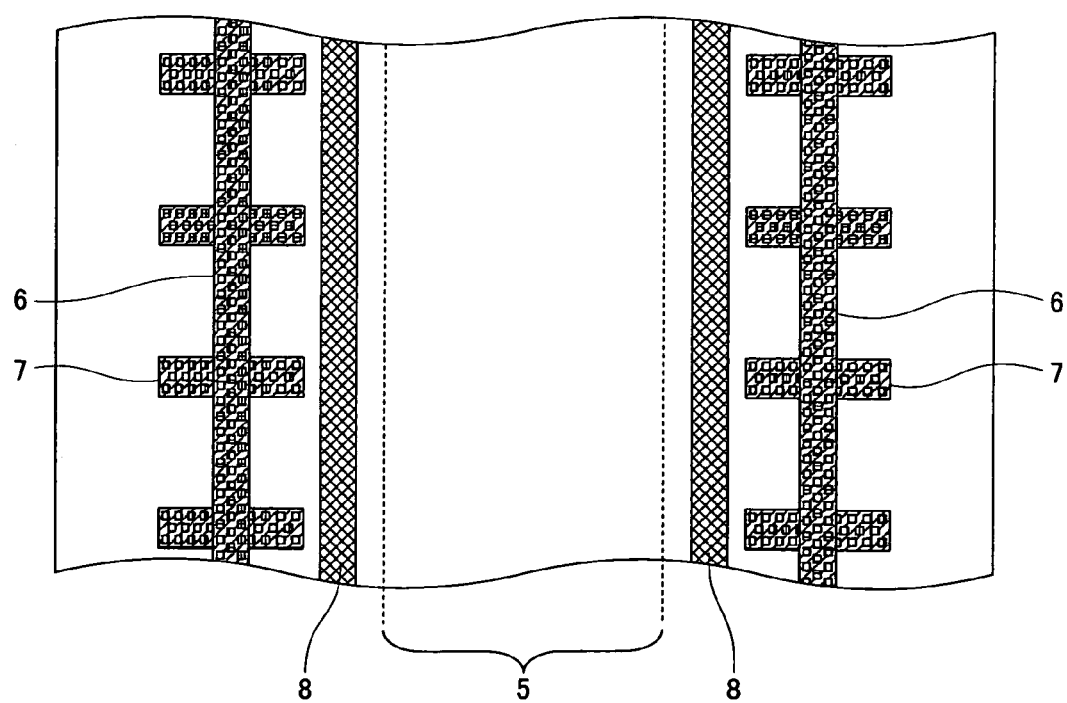
FIG. 19B is a sectional view illustrating a layout of a seal ring in a semiconductor wafer of a semiconductor device according to a twenty-first embodiment of the present invention after completion of a wiring step in a diffusion process.

In a twenty-first embodiment, as illustrated in FIG. 19B, a second seal ring 8 serving as a main band of a seal section has a single-layer structure of a metal layer, and each of a first seal ring 6 serving as a main band of the seal section and a first auxiliary part 7 serving as a sub band of the seal section has a multilayer structure of a plurality of layers. This multilayer structure may be equal to those in the second, third and fourth embodiments.

As described above, the seal section includes the second seal ring 8 having a single-layer structure of a metal layer, and the first auxiliary part 7 and the first seal ring 6 each having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Twenty-Second Embodiment

Figure 20:
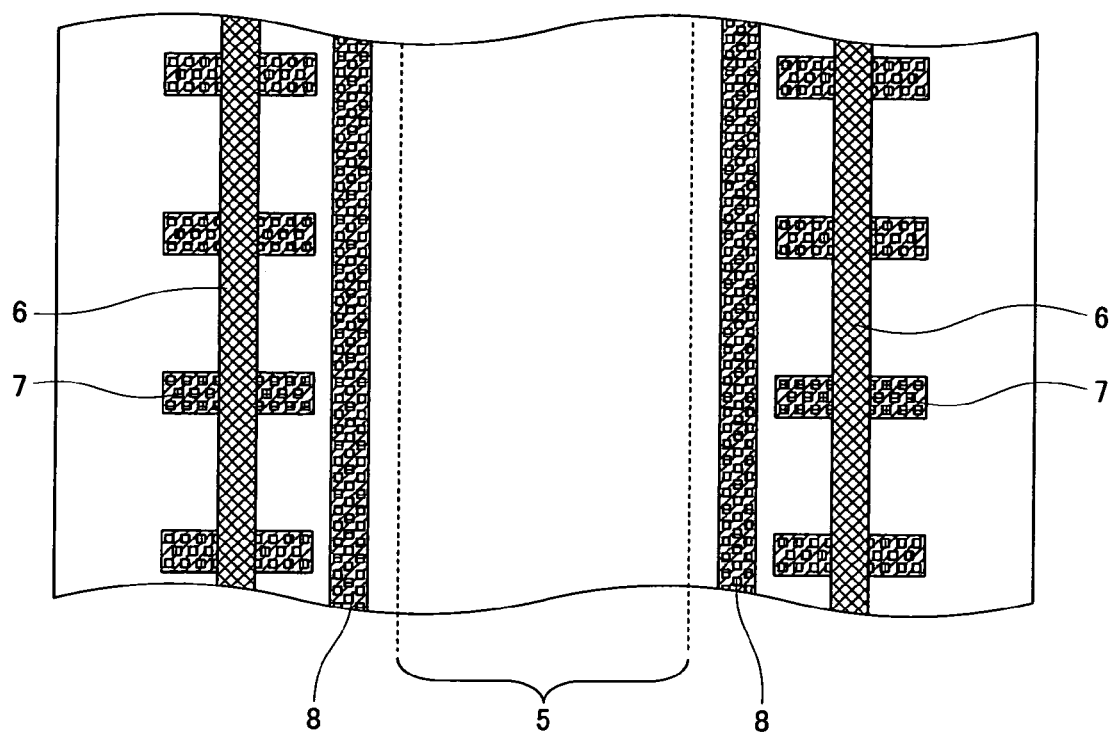
FIG. 20 is a sectional view illustrating a layout of a seal ring in a semiconductor wafer of a semiconductor device according to a twenty-second embodiment of the present invention after completion of a wiring step in a diffusion process.

In a twenty-second embodiment, as illustrated in FIG. 20, a first seal ring 6 serving as a main band of a seal section has a single-layer structure of a metal layer, and each of a second seal ring 8 serving as a main band of the seal section and a first auxiliary part 7 serving as a sub band of the seal section has a multilayer structure of a plurality of layers. This multilayer structure may be equal to those described in the second, third and fourth embodiments.

As described above, the seal section includes the first seal ring 6 having a single-layer structure of a metal layer, and the first auxiliary part 7 and the second seal ring 8 each having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Twenty-Third Embodiment

Figure 21A:
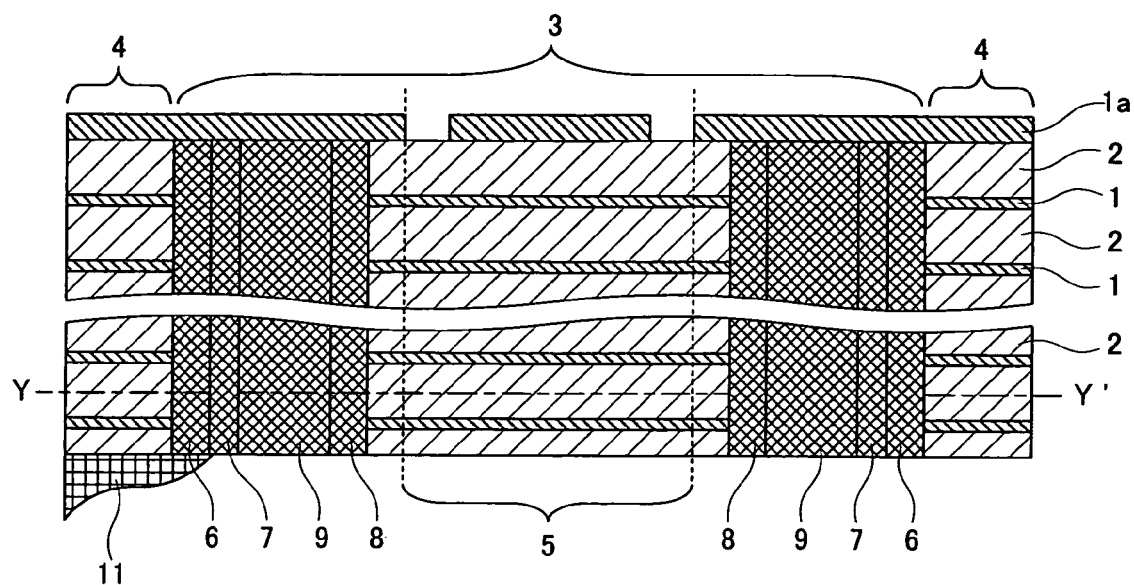
FIG. 21A is a sectional view illustrating a semiconductor wafer of a semiconductor device according to a twenty-third embodiment of the present invention after completion of a wiring step in a diffusion process.
Figure 21B:
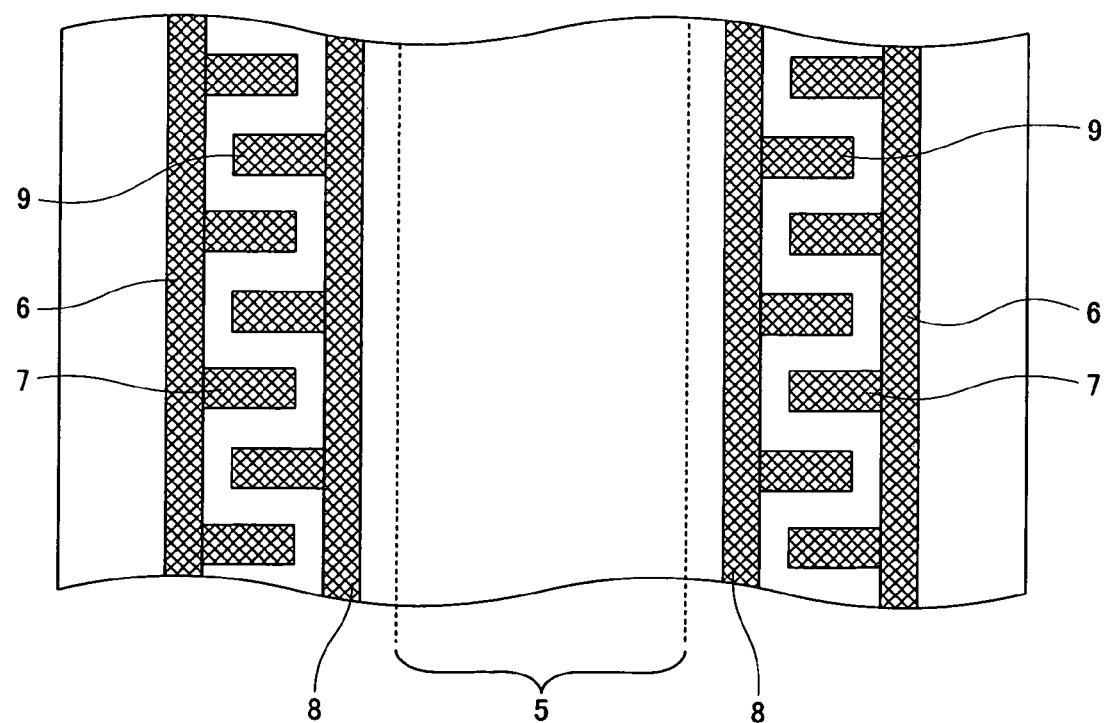
FIG. 21B is a sectional view taken along a line Y-Y' in FIG. 21A.

Next, FIGS. 21A and 21B illustrate a semiconductor device according to a twenty-third embodiment of the present invention. It is to be noted that similar components to those described with reference to FIGS. 1A, 1B, 9A and 9B are denoted by identical symbols; therefore, detailed description thereof will not be given here. In the twenty-third embodiment, as illustrated in FIG. 21A, a seal section is provided at a boundary region in a scribe grid region 3. The boundary region separates the scribe grid region 3 from a semiconductor element region 4. The seal section has a dual structure that a pair of first seal rings 6, each surrounding an outer periphery of the semiconductor element region 4 and serving as a main band, and a pair of second seal rings 8, each located at a position close to the scribe grid region 3 as compared with the first seal ring 6 and serving as a main band, are arranged in parallel. In the scribe grid region 3, a PCM and dicing region 5 is defined between the second seal rings 8.

As illustrated in FIG. 21B, a plurality of first auxiliary parts 7 each serving as a sub band are formed intermittently at regular intervals and are arranged along the first seal rings 6. Further, a plurality of second auxiliary parts 9 also each serving as a sub band are formed intermittently at regular intervals and are arranged along the second seal rings 8.

Each first auxiliary part 7 extends in a direction orthogonal to the first seal ring 6, that is, extends from the first seal ring 6 toward the PCM and dicing region 5. Each second auxiliary part 9 extends in a direction orthogonal to the second seal ring 8, that is, extends from the second seal ring 8 toward the semiconductor element region 4. The first auxiliary part 7 functions as a retaining wall for the first seal ring 6, and the second auxiliary part 9 functions as a retaining wall for the second seal ring 8.

As described above, the seal section has a dual structure and the auxiliary parts are arranged in multiple, so that the twenty-third embodiment exhibits functional effects similar to those in the first, fifth and eleventh embodiments. Thus, it is possible to prevent internal separation or chipping with higher certainty.

Twenty-Fourth Embodiment

Figure 22A:
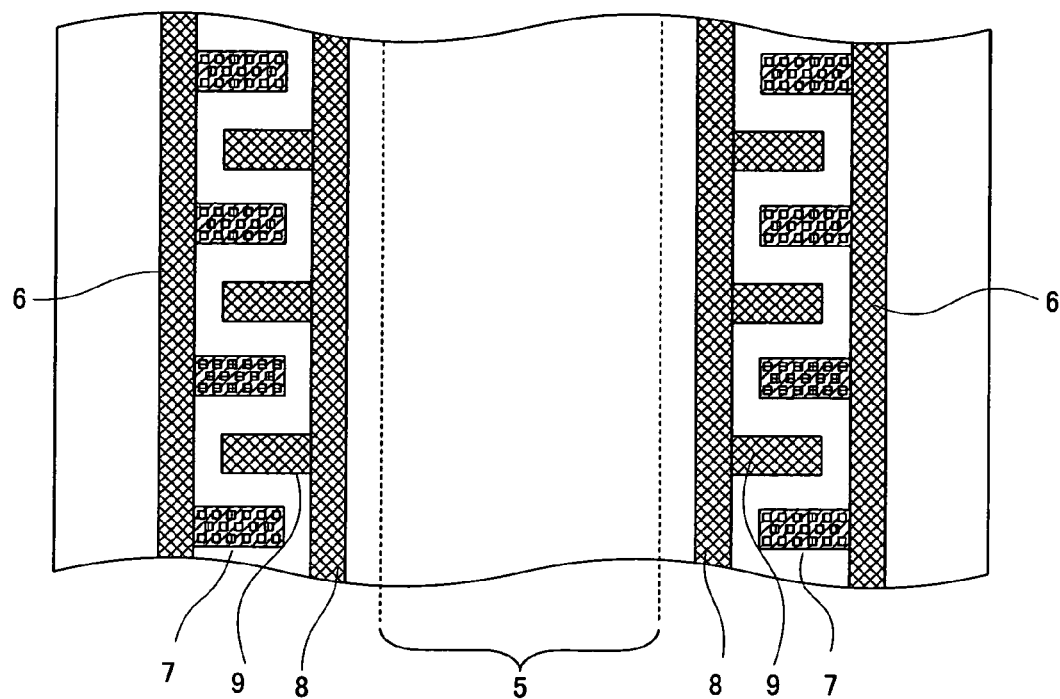
FIG. 22A is a sectional view illustrating a layout of a seal ring in a semiconductor wafer of a semiconductor device according to a twenty-fourth embodiment of the present invention after completion of a wiring step in a diffusion process.

In the twenty-third embodiment, each of the first seal ring 6 serving as a main band of the seal section, the second seal ring 8 also serving as a main band of the seal section, the first auxiliary part 7 serving as a sub band of the seal section, and the second auxiliary part 9 also serving as a sub band of the seal section has a single-layer structure of a metal layer. On the other hand, in a twenty-fourth embodiment, as illustrated in FIG. 22A, a first auxiliary part 7 has a multilayer structure of a plurality of layers. This multilayer structure may be equal to those described in the second, third and fourth embodiments.

As described above, a seal section includes a first seal ring 6, a second seal ring 8 and a second auxiliary part 9 each having a single-layer structure of a metal layer, and the first auxiliary part 7 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Twenty-Fifth Embodiment

Figure 22B:
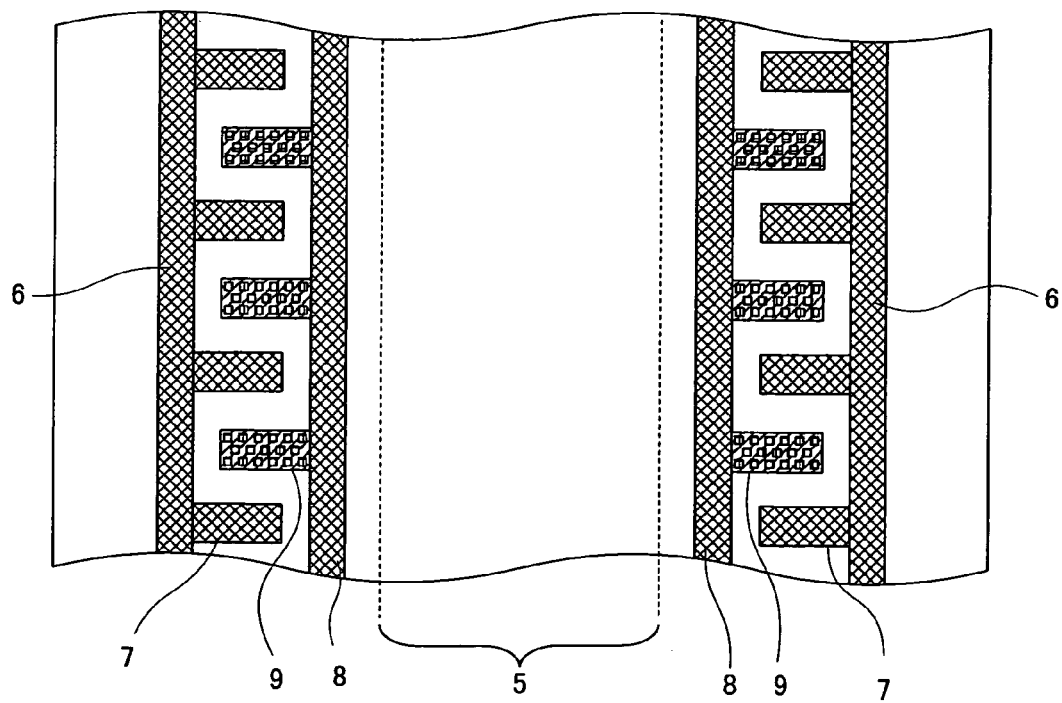
FIG. 22B is a sectional view illustrating a layout of a seal ring in a semiconductor wafer of a semiconductor device according to a twenty-fifth embodiment of the present invention after completion of a wiring step in a diffusion process.

In a twenty-fifth embodiment, as illustrated in FIG. 22B, each of a first seal ring 6 serving as a main band of a seal section, a second seal ring 8 also serving as a main band of the seal section, and a first auxiliary part 7 serving as a sub band of the seal section has a single-layer structure of a metal layer, and a second auxiliary part 9 serving as a sub band of the seal section has a multilayer structure of a plurality of layers. This multilayer structure may be equal to those described in the second, third and fourth embodiments.

As described above, the seal section includes the first seal ring 6, the second seal ring 8 and the first auxiliary section 7 each having a single-layer structure of a metal layer, and the second auxiliary part 9 having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Twenty-Sixth Embodiment

Figure 23:
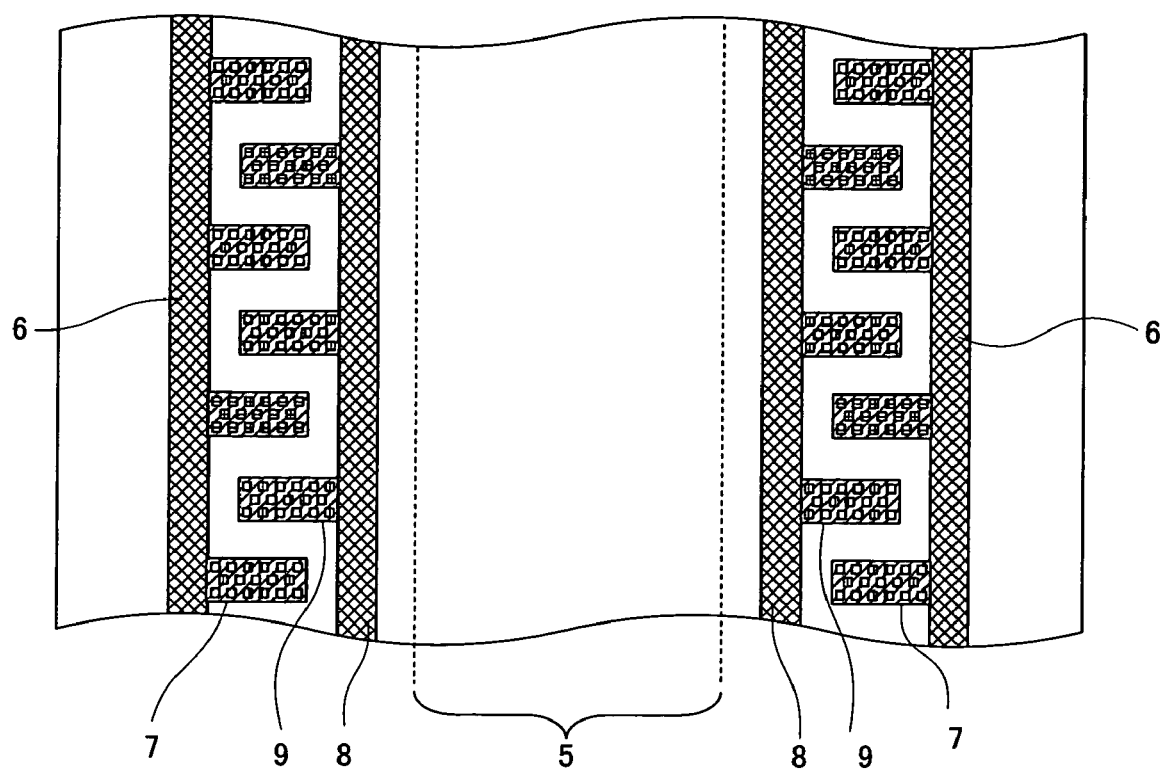
FIG. 23 is a sectional view illustrating a layout of a seal ring in a semiconductor wafer of a semiconductor device according to a twenty-sixth embodiment of the present invention after completion of a wiring step in a diffusion process.

In a twenty-sixth embodiment, as illustrated in FIG. 23, each of a first seal ring 6 serving as a main band of a seal section and a second seal ring 8 also serving as a main band of the seal section has a single-layer structure of a metal layer, and each of a first auxiliary part 7 serving as a sub band of the seal section and a second auxiliary part 9 also serving as a sub band of the seal section has a multilayer structure of a plurality of layers. This multilayer structure may be equal to those described in the second, third and fourth embodiments.

As described above, the seal section includes the first ring 6 and the second ring 8 each having a single-layer structure of a metal layer, and the first auxiliary part 7 and the second auxiliary part 9 each having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Twenty-Seventh Embodiment

Figure 24A:
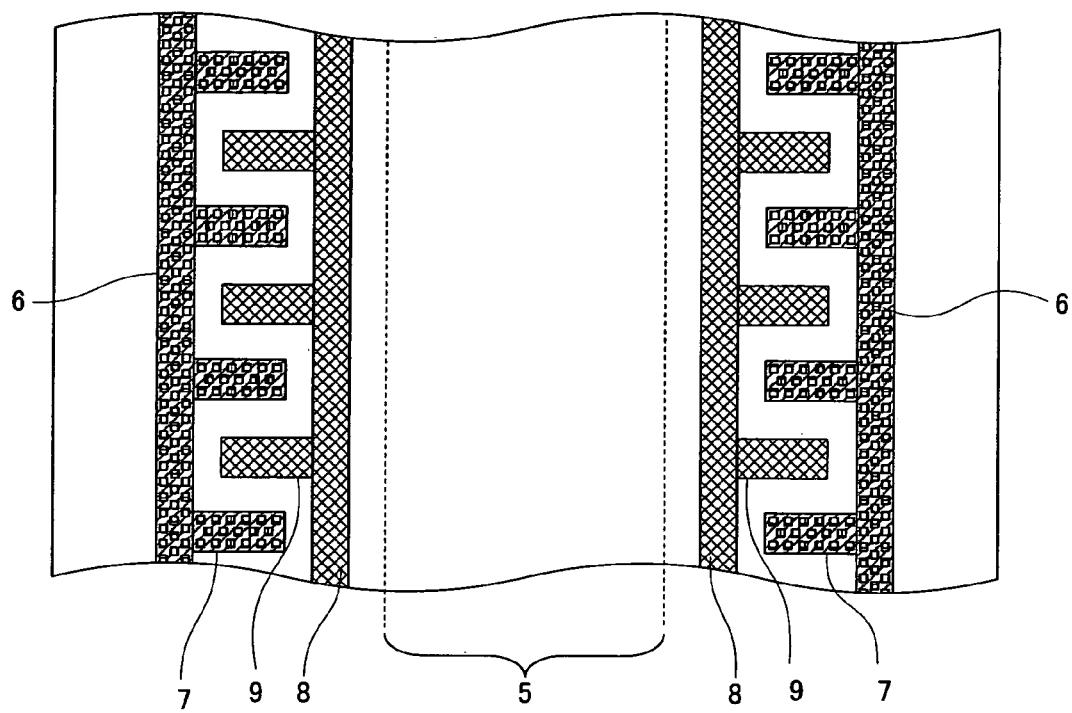
FIG. 24A is a sectional view illustrating a layout of a seal ring in a semiconductor wafer of a semiconductor device according to a twenty-seventh embodiment of the present invention after completion of a wiring step in a diffusion process.

In a twenty-seventh embodiment, as illustrated in FIG. 24A, each of a second seal ring 8 serving as a main band of a seal section and a second auxiliary part 9 serving as a sub band of the seal section has a single-layer structure of a metal layer, and each of a first ring 6 serving as a main band of the seal section and a first auxiliary part 7 serving as a sub band of the seal section has a multilayer structure of a plurality of layers. This multilayer structure may be equal to those described in the second, third and fourth embodiments.

As described above, the seal section includes the second seal ring 8 and the second auxiliary part 9 each having a single-layer structure of a metal layer, and the first seal ring 6 and the first auxiliary part 7 each having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Twenty-Eighth Embodiment

Figure 24B:
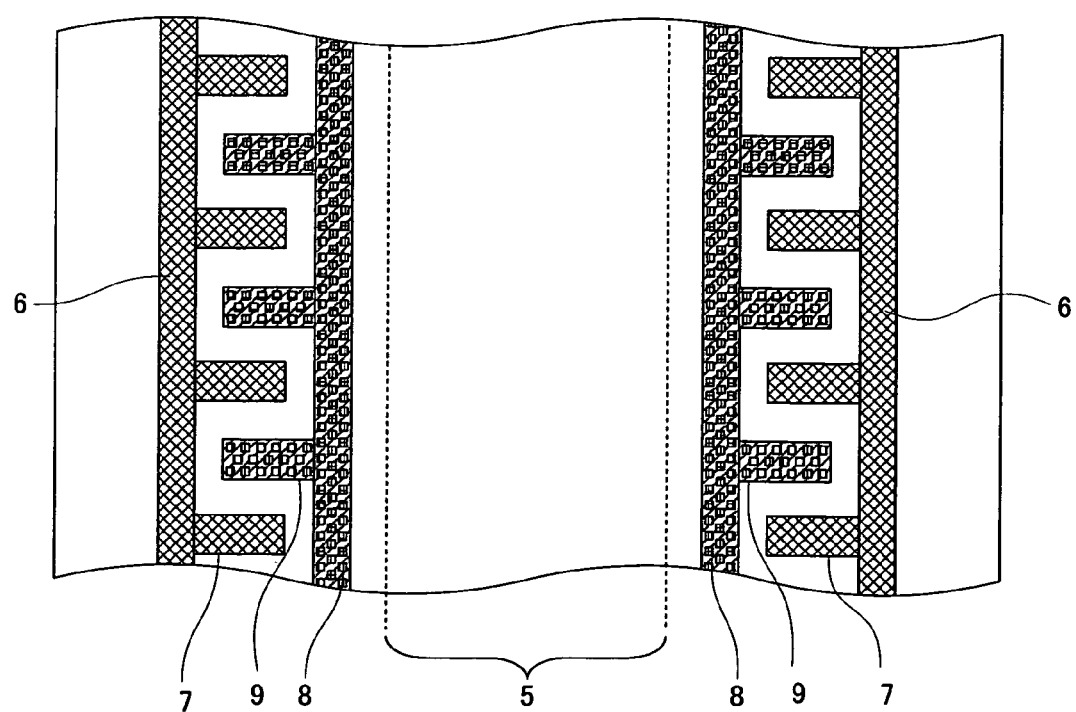
FIG. 24B is a sectional view illustrating a layout of a seal ring in a semiconductor wafer of a semiconductor device according to a twenty-eighth embodiment of the present invention after completion of a wiring step in a diffusion process.

In a twenty-eighth embodiment, as illustrated in FIG. 24B, each of a first seal ring 6 serving as a main band of a seal section and a first auxiliary part 7 serving as a sub band of the seal section has a single-layer structure of a metal layer, and each of a second seal ring 8 serving as a main band of the seal section and a second auxiliary part 9 serving as a sub band of the seal section has a multilayer structure of a plurality of layers. This multilayer structure may be equal to those described in the second, third and fourth embodiments.

As described above, the seal section includes the first ring 6 and the first auxiliary part 7 each having a single-layer structure of a metal layer, and the second seal ring 8 and the second auxiliary part 9 each having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Twenty-Ninth Embodiment

Figure 25A:
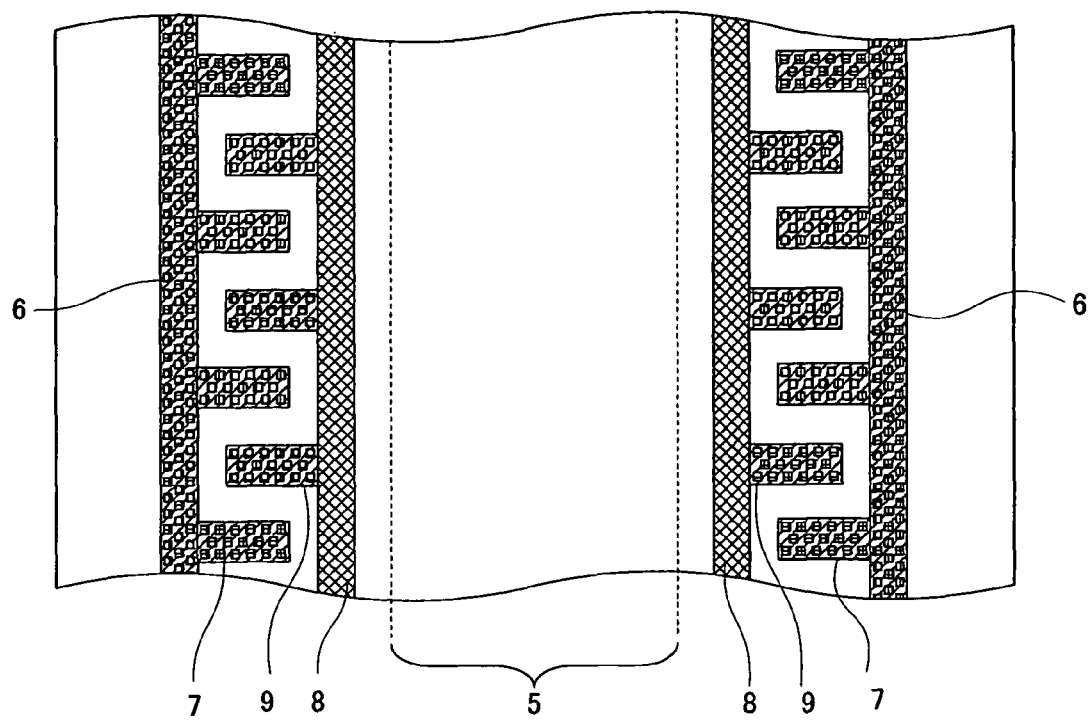
FIG. 25A is a sectional view illustrating a layout of a seal ring in a semiconductor wafer of a semiconductor device according to a twenty-ninth embodiment of the present invention after completion of a wiring step in a diffusion process.

In a twenty-ninth embodiment, as illustrated in FIG. 25A, a second seal ring 8 serving as a main band of a seal section has a single-layer structure of a metal layer, and each of a first seal ring 6 serving as a main band of the seal section, a first auxiliary part 7 serving as a sub band of the seal section, and a second auxiliary part 9 also serving as a sub band of the seal section has a multilayer structure of a plurality of layers. This multilayer structure may be equal to those described in the second, third and fourth embodiments.

As described above, the seal section includes the second seal ring 8 having a single-layer structure of a metal layer, and the first seal ring 6, the first auxiliary part 7 and the second auxiliary part 9 each having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

Thirtieth Embodiment

Figure 25B:
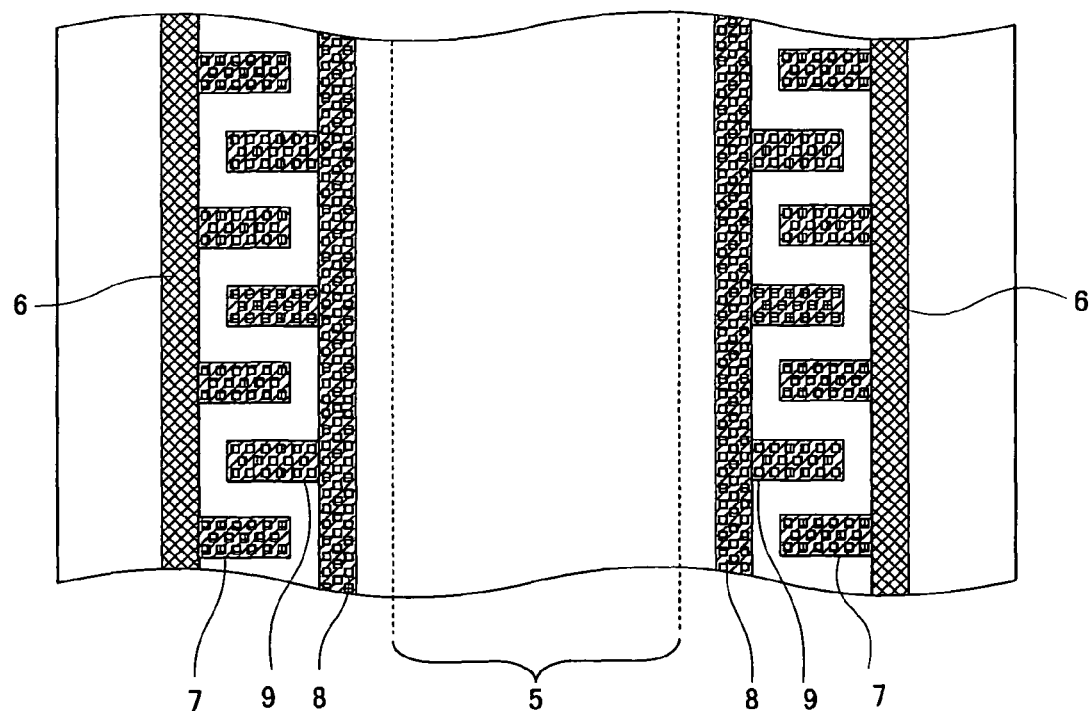
FIG. 25B is a sectional view illustrating a layout of a seal ring in a semiconductor wafer of a semiconductor device according to a thirtieth embodiment of the present invention after completion of a wiring step in a diffusion process.
Figure 26:
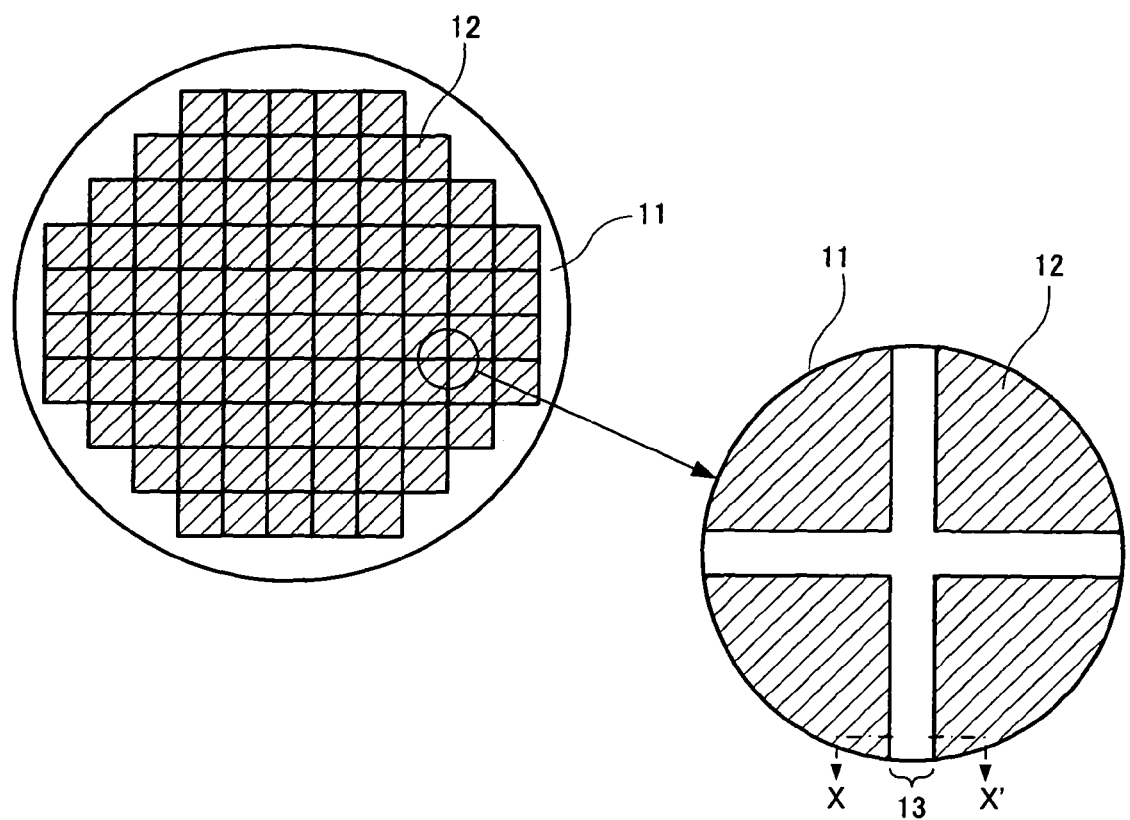
FIG. 26 is a plan view and an enlarged view each illustrating a conventional semiconductor device.
Figure 27A:
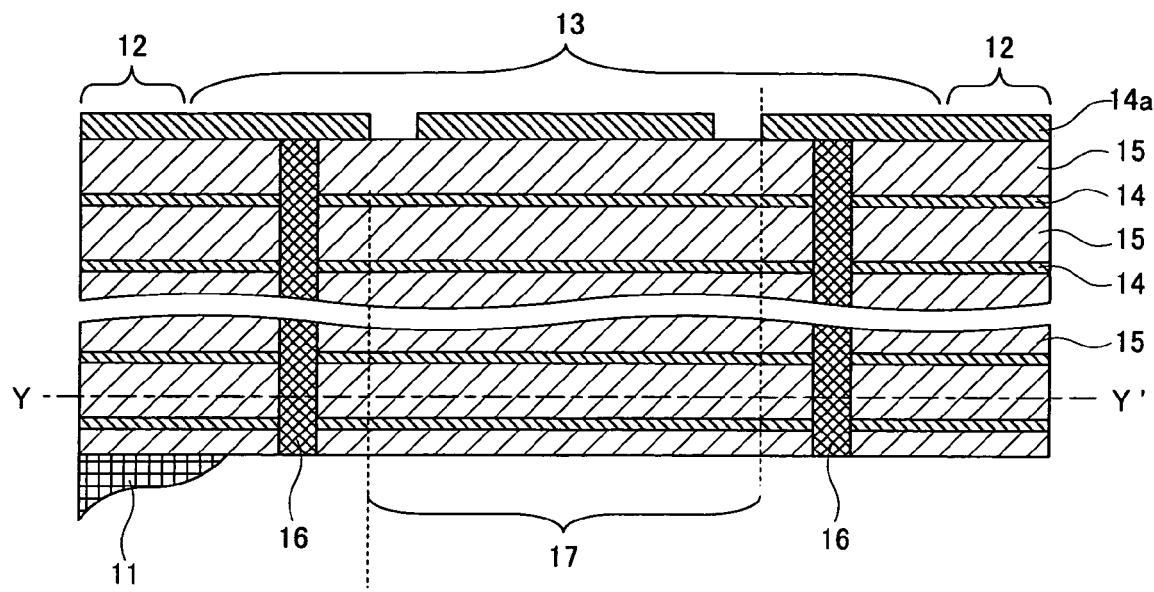
FIG. 27A is a sectional view taken along a line X-X' in FIG. 26.
Figure 27B:
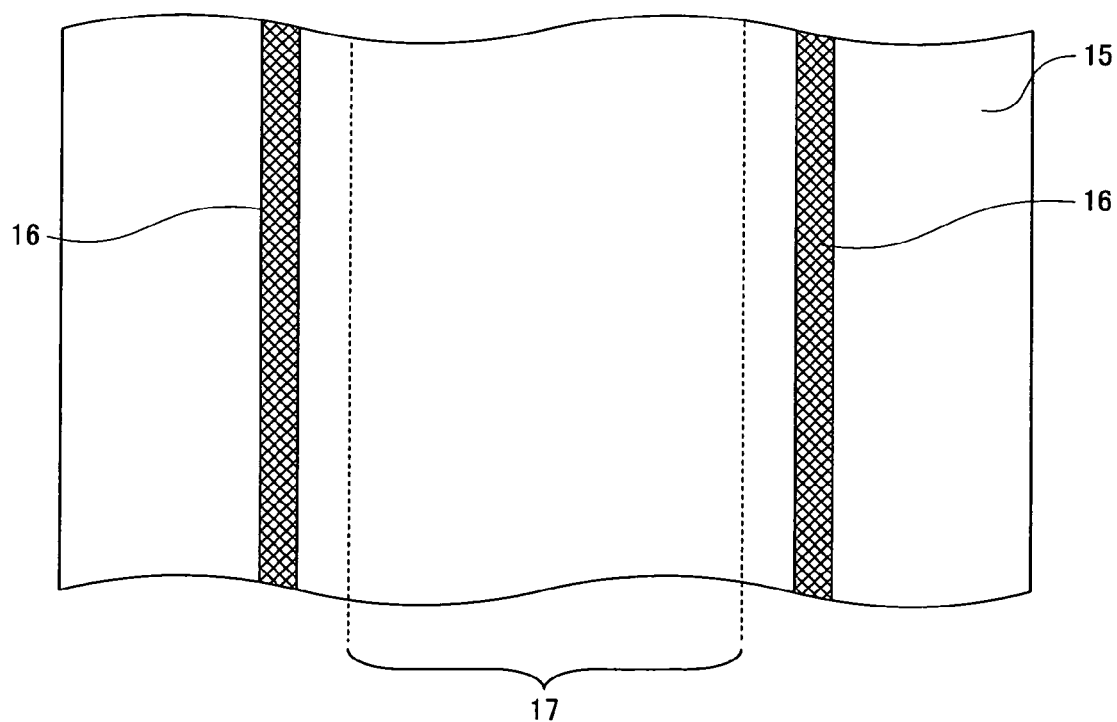
FIG. 27B is a sectional view taken along a line Y-Y' in FIG. 27A.

In a thirtieth embodiment, as illustrated in FIG. 25B, a first seal ring 6 serving as a main band of a seal section has a single-layer structure of a metal layer, and each of a second seal ring 8 serving as a main band of the seal section, a first auxiliary part 7 serving as a sub band of the seal section, and a second auxiliary part 9 also serving as a sub band of the seal section has a multilayer structure of a plurality of layers. This multilayer structure may be equal to those described in the second, third and fourth embodiments.

As described above, the seal section includes the first seal ring 6 having a single-structure layer of a metal layer, and the second seal ring 8, the first auxiliary part 7 and the second auxiliary part 9 each having a multilayer structure; thus, a protection film 1a and an interlayer insulating film 1 in a scribe grid region 3 can be prevented from occurrence of chipping, internal separation or damage with higher certainty. As a result, it is possible to provide a semiconductor device with improved reliability.

What is claimed is:

1. A semiconductor device comprising:
   a semiconductor substrate including a semiconductor element region and a seal section formed in an outer region laterally outward from the semiconductor element region,
   wherein the seal section includes a main band and a sub band,
   the main band is contiguous to the semiconductor element region,
   the sub band comprises intermittent segments adjacent to the main band,
   the sub band has a multilayer structure in which a plurality of wiring layers and a plurality of insulating layers are laminated in alternate layers,
   a plurality of vias extend between the uppermost wiring layer and the lowermost wiring layer,
   and wherein a direction along the main band is a column direction and a direction orthogonal to the main band is a row direction, the vias adjacent to each other in the column direction are aligned and the vias adjacent to each other in the row direction are misaligned.

2. A semiconductor device comprising:
a semiconductor substrate including a semiconductor element region and a seal section formed in an outer region laterally outward from the semiconductor element region,
wherein the seal section includes a first main band, a second main band and at least one sub band,
the first main band is contiguous to the semiconductor element region,
the second main band is contiguous to the semiconductor element region in an outer region laterally outward from the first main band,
each sub band comprises intermittent segments adjacent to the first main band, an end of each sub band extends from the first main band to the semiconductor element region, and
another end of each band extends from the first main band to the second main band and is not connected to the second main band.

3. The semiconductor device according to claim 1,
wherein the seal section is covered with an electrical insulating film.

4. The semiconductor device according to claim 1,
wherein the main band comprises a metal selected from the group consisting of copper, aluminum, tungsten, titanium, tantalum, and a metal compound containing at least one of copper, aluminum, tungsten, titanium, and tantalum.

5. The semiconductor device according to claim 1,
wherein the sub band extends in at least one direction either from the main band toward the semiconductor element region or from the main band toward an outermost edge of the semiconductor substrate.

6. The semiconductor device according to claim 4,
wherein the sub band comprises a metal layer.

7. The semiconductor device according to claim 1,
wherein the seal section includes a plurality of main bands, and at least one of the main bands of the seal section comprises a multilayer structure comprising a plurality of wiring layers and a plurality of vias extending between the upper wiring layer and the lower wiring layer.

8. The semiconductor device according claim 1,
wherein the upper via and the lower via with the wiring layer therebetween are located at different positions in a direction normal to the wiring layer.

9. The semiconductor device according to claim 7,
wherein the upper via and the lower via with the wiring layer therebetween are located at different positions in a direction normal to the wiring layer.

10. The semiconductor device according to claim 1,
wherein the semiconductor device comprises a plurality of interspersed layers of a soft insulating film and a hard interlayer insulating film stacked on a semiconductor substrate.

11. The semiconductor device according to claim 10,
wherein the seal section extends throughout the interspersed layers, from the semiconductor substrate to the upper surface of the topmost layer.

12. The semiconductor device according to claim 1,
wherein the sub band comprises intermittent segments physically contacting and extending from the main band.

13. The semiconductor device according to claim 1,
comprising at least two main bands and at least one sub band,
wherein the at least one sub band of the seal section comprises intermittent segments physically distinct from and adjacent to at least one of said main bands.

14. The semiconductor device according to claim 13,
comprising two sub bands,
wherein each of the two sub bands is adjacent to a respective main band of the at least two main bands and spaced from the other of the two main bands, and
an intermittent segment of a first sub band is located between two adjacent intermittent segments of a second sub band, such that a plane parallel to one of the two main bands and perpendicular to the upper surface of the topmost layer intersects each of the first and second sub bands.

15. The semiconductor device according to claim 13,
comprising two sub bands,
wherein two main bands are parallel to each other,
the two sub bands are adjacent to a first main band, and
the two sub bands extend perpendicularly from the first main band toward a second main band and spaced from the second main band.

16. The semiconductor device according to claim 13,
wherein the at least one sub band has a multilayer structure comprising a plurality of wiring layers and a plurality of alternating laminated insulating layers, and a plurality of vias extending between the upper wiring layer and the lower wiring layer.

17. The semiconductor device according to claim 13,
wherein the at least one of the two main bands has a multilayer structure comprising a plurality of wiring layers and a plurality of alternating laminated insulating layers and a plurality of vias extending between the upper wiring layer and the lower wiring layer.

18. A semiconductor device comprising:
a semiconductor substrate including a semiconductor element region and a seal section formed in an outer region other than the semiconductor element region,
wherein the seal section includes a main band and a sub band, the main band is contiguous along the semiconductor element region, and the sub band comprises intermittent segments adjacent to the main band,
the sub band has a multilayer structure wherein plurality of wiring layers and a plurality of insulating layer are laminated alternately,
a plurality of vias extend between the upper wiring layer and the lower wiring layer,
and wherein a direction along the main band is a column direction and a direction orthogonal to the main band is a row direction, the vias adjacent to each other in the row direction are aligned, and from among adjoining rows the vias arranged in one of the rows and vias arranged in the other one of rows are misaligned in the column direction.

19. The semiconductor device according to claim 2,
wherein the sub band is located on a center of the first main band.

* * * * *